United States Patent
Nakazawa et al.

(10) Patent No.: US 6,411,349 B2
(45) Date of Patent: *Jun. 25, 2002

(54) SEMICONDUCTOR DEVICE, DISPLAY APPARATUS USING SUCH DEVICES AND METHOD OF MANUFACTURING SUCH AN APPARATUS AS WELL AS THAT OF MANUFACTURING SUCH AN APPARATUS

(75) Inventors: Toru Nakazawa, Atsugi; Katsumi Kurematsu, Hiratsuka; Osamu Koyama, Hachioji, all of (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/177,606

(22) Filed: Oct. 23, 1998

(30) Foreign Application Priority Data

Oct. 27, 1997 (JP) .............................. 9-294463

(51) Int. Cl.[7] .......................... G02F 1/136; G02F 1/13; H01L 29/04
(52) U.S. Cl. .......................... 349/42; 349/43; 349/187; 257/59; 257/72
(58) Field of Search ..................... 349/42, 43, 187, 349/5–8; 257/59, 72

(56) References Cited

U.S. PATENT DOCUMENTS

| | | | | | |
|---|---|---|---|---|---|
| 4,981,525 | A | * | 1/1991 | Kiyama et al. | 136/244 |
| 5,495,351 | A | | 2/1996 | Shingaki et al. | 359/53 |
| 5,568,287 | A | | 10/1996 | Shingaki et al. | 359/53 |
| 5,585,951 | A | * | 12/1996 | Noda et al. | 349/122 |
| 5,616,960 | A | * | 4/1997 | Noda et al. | 257/760 |
| 5,736,750 | A | * | 4/1998 | Yamazaki et al. | 257/59 |
| 5,843,842 | A | * | 12/1998 | Lee et al. | 438/688 |
| 5,847,795 | A | | 12/1998 | Satoh et al. | 349/137 |
| 5,939,787 | A | * | 8/1999 | Lee | 257/740 |
| 6,028,325 | A | * | 2/2000 | Yamazaki | 257/66 |
| 6,093,943 | A | * | 7/2000 | Ikemasu et al. | 257/306 |

* cited by examiner

*Primary Examiner*—William L. Sikes
*Assistant Examiner*—Tarifur R. Chowdhury
(74) *Attorney, Agent, or Firm*—Fitzpatrick, Cella, Harper & Scinto

(57) ABSTRACT

A semiconductor device comprises a contact hole for connecting electroconductive films having a stepped profile with the top having a size greater than the bottom, the top size of the contact hole being defined in a self-aligning manner by another film disposed between said electroconductive films.

15 Claims, 24 Drawing Sheets

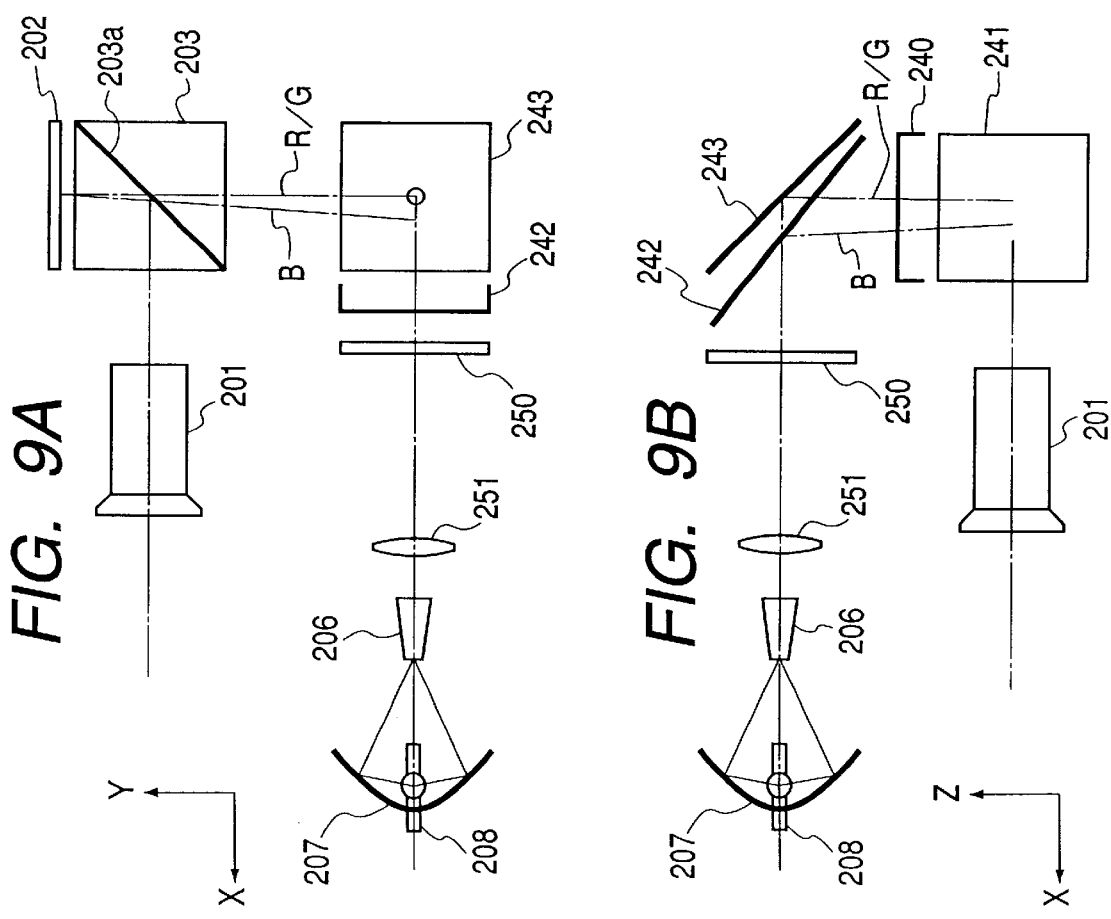

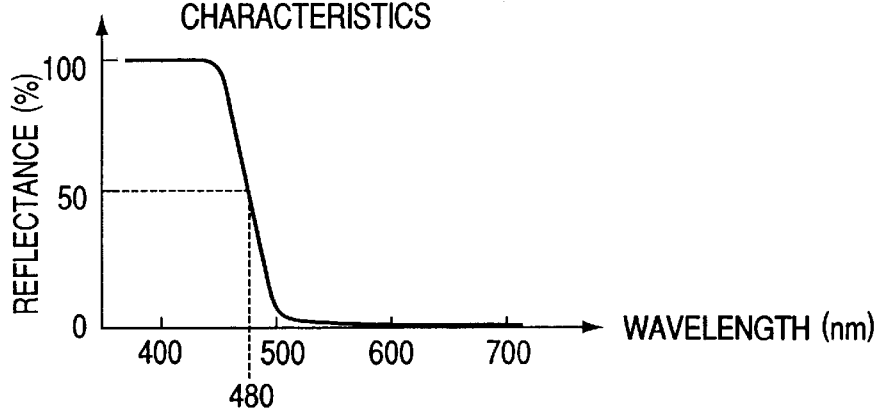
FIG. 10A  242: B REFLECTION DICHROIC MIRROR SPECTRUM LIGHT REFLECTION CHARACTERISTICS
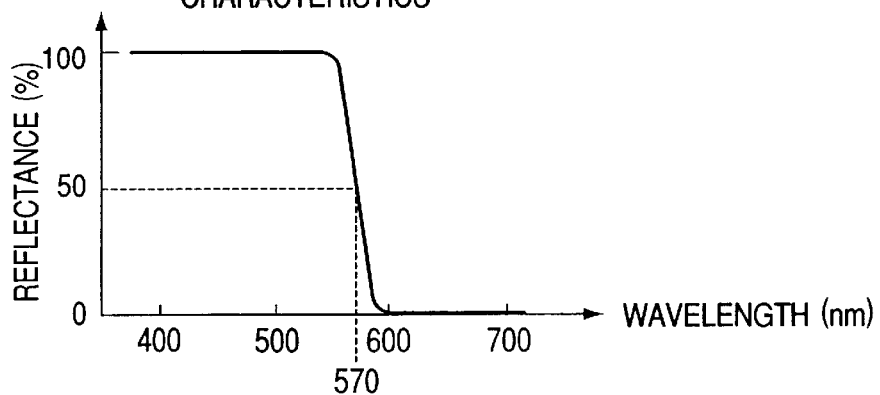
FIG. 10B  241: B/G REFLECTION DICHROIC MIRROR SPECTRUM LIGHT REFLECTION CHARACTERISTICS
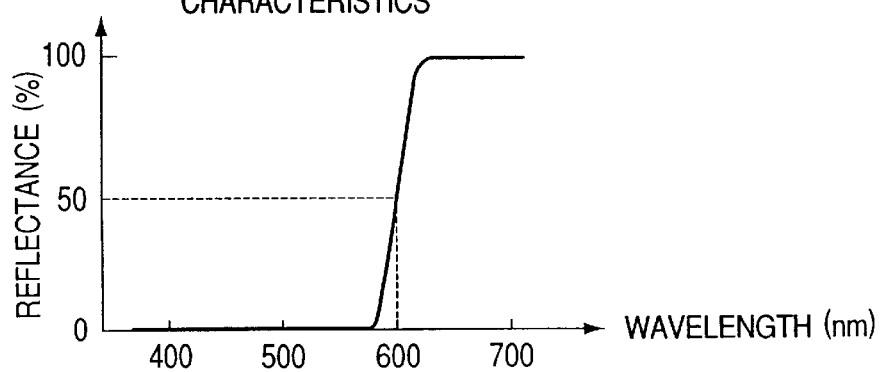
FIG. 10C  240: R REFLECTION DICHROIC MIRROR SPECTRUM LIGHT REFLECTION CHARACTERISTICS

RGB MIXED ARBITRARY COLOR

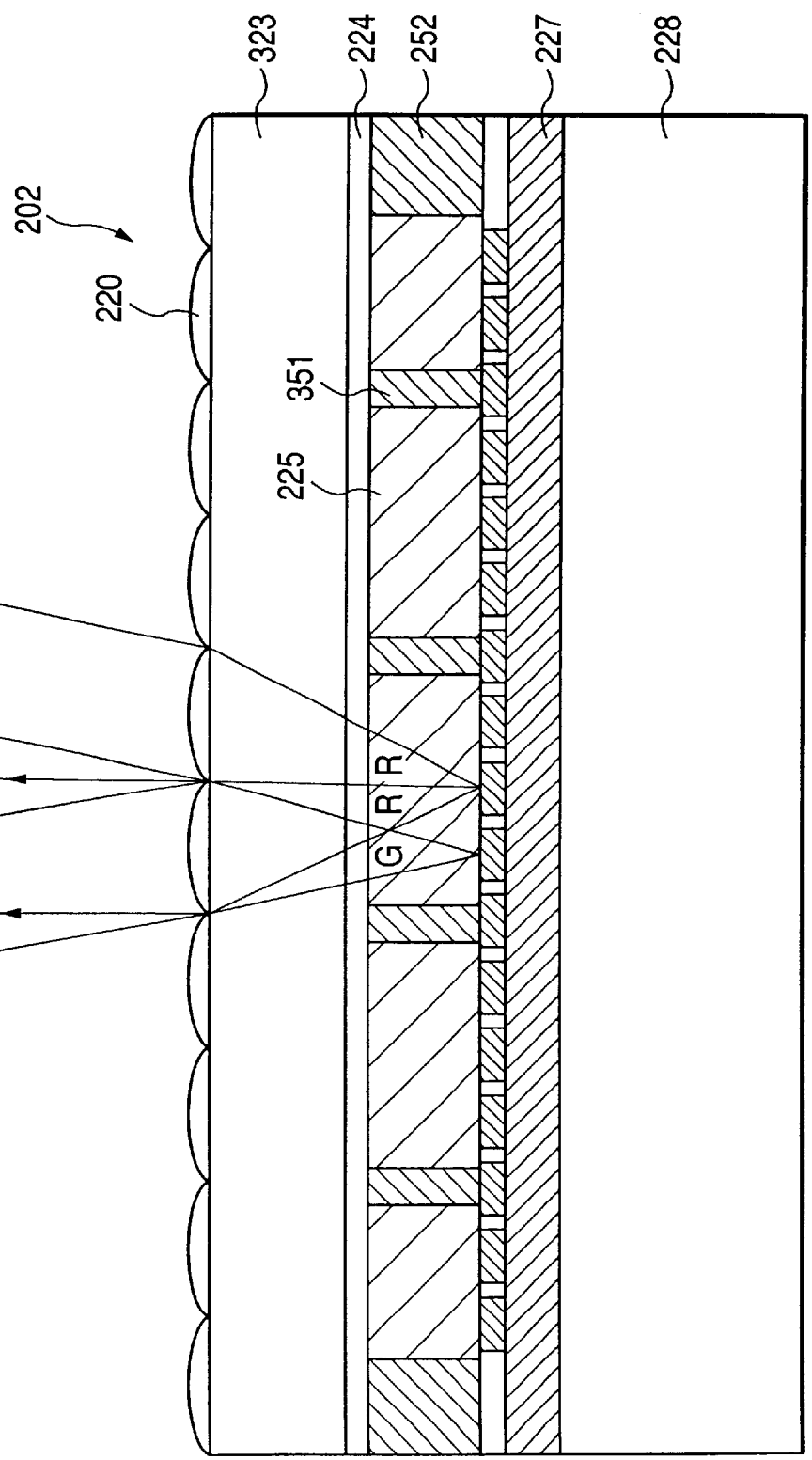

SEMICONDUCTOR DEVICE, DISPLAY APPARATUS USING SUCH DEVICES AND METHOD OF MANUFACTURING SUCH AN APPARATUS AS WELL AS THAT OF MANUFACTURING SUCH AN APPARATUS

BACKGROUND OF THE INVENTION

1. Field of the Invention

This invention relates to a semiconductor device and, more particularly, it relates to a method of forming a contact hole for electrically connecting a lower electroconductive film and an upper electroconductive film arranged with an insulation film interposed therebetween. The present invention also relates to a liquid crystal apparatus such as a display apparatus using such devices.

2. Related Background Art

In recent years, display apparatus have been playing ever-increasing important roles as means of multi-media communication using images, sounds and written texts. Of them, liquid crystal display apparatus have the advantage of being very thin and consuming little power and the industry of manufacturing liquid crystal display apparatus has grown to a major industry that is comparable with the semiconductor manufacturing industry. It is expected that liquid crystal display apparatus are used in the future not only for personal computers but also for work stations and home television sets having a large display screen. However, a large liquid crystal display apparatus having a large screen is accompanied by high manufacturing cost and electric requirements to be met to drive its large screen. Normally, the manufacturing cost of a liquid crystal display apparatus increases as a function of the square to the cube of the size of the display screen.

In an attempt to bypass this problem, projection systems adapted to optically enlarge the image formed on a relatively small liquid crystal display screen for viewing have been attracting attention. Such a system has become feasible due to the recent technological development that has made it possible to manufacture high-performance micro-semiconductor devices on a mass production basis to exploit the scale merit.

Recently, reflection type liquid crystal panels realized by forming an active matrix circuit including peripheral drive circuits on a semiconductor substrate and comprising pixel electrodes for driving liquid crystal that operate also as reflectors for reflecting light have been attracting attention from the viewpoint of low cost and high image quality.

FIG. 23 of the accompanying drawings is a partial cross sectional view of a known reflection type liquid crystal panel.

Referring to FIG. 23, it shows a semiconductor substrate 1, p-type wells 2, n-type wells 2', transistor source regions 3, 3', transistor gate regions 4, transistor drain regions 5, 5', a filed oxide film 6, a shield layer 7, insulation layers 8, 8', an insulation layer 9, source electrodes 10, drain electrodes 11, pixel electrodes 12, an anti-reflection film 13, a liquid crystal material 14, a common transparent electrode 15, an opposite electrode 16, high concentration impurity layers 17, 17', a P—SiO layer, a display region 19, an anti-reflection film 20, an insulation layer 21, a seal member 22, a through hole 23, a matrix substrate (for semiconductor devices) 24, a P—SiO layer 18-1 and an SOG layer 18-2.

In the final stage of preparing the matrix substrate (for semiconductor devices) 24 of a reflection type liquid crystal panel as illustrated in FIG. 23, the pixel electrodes 12 are separated from each other by the insulation film 9 and, at the same time, the surfaces are smoothed and polished by CMP (chemical mechanical polishing) as the pixel electrodes 12 also operate as reflectors.

However, as shown, the through hole 23 leaves its vestige in the form of a recess on the corresponding pixel electrode 12 after the CMP operation so that light is reflected by the recess not perfectly as desired but irregularly to reduce the brightness and the contrast of the displayed images.

Such recesses may be produced by an insufficiently buried pixel electrode film and then the yield of manufacturing liquid crystal panels can be reduced due to defective electric conductivity of through holes.

While a round-etching technique is known to enlarge the size of the through hole at the top thereof to avoid the problem of an insufficiently buried pixel electrode, the technique involves a number of additional steps and large cost.

On the other hand, with a reflow technique using metal such as aluminum and high temperature sputtering to utilize the metal as pixel electrode, the metal film should be made very thick in order to completely bury the through hole 23. Then, the time required for depositing the metal film and polishing the film by CMP is enormous to remarkably raise the overall cost of manufacturing a semiconductor device if compared with conventional manufacturing methods.

SUMMARY OF THE INVENTION

Therefore, it is an object of the present invention to provide a semiconductor device comprising a contact hole for connecting electroconductive films having a stepped profile with the top having a size greater than the bottom, the top size of the contact hole being defined in a self-aligning manner by another film disposed between said electroconductive films.

Another object of the invention is to provide a method of manufacturing a semiconductor device having a semiconductor substrate, a principal electrode mounted on the substrate and a contact hole, characterized in that said method comprises steps of:

(1) forming a coat of a first insulation film on the surface of the substrate;

(2) forming a coat of a first electroconductive film and patterning it to a desired profile;

(3) forming a coat of a second insulation film and patterning it to a desired profile, said first insulation film being simultaneously processed in a self-aligning manner relative to the patterned profile of said first electroconductive film within the region produced by removing said first electroconductive film in step (2) and located within the region being removed of the second insulation film;

(4) forming a coat of a third insulation film and forming a contact hole connected to said principal electrode of the semiconductor device within the region of said first insulation film processed in a self-aligning manner relative to the patterned profile of said first electroconductive film in said step (3); and (5) forming a coat of a second electroconductive film and patterning it to a desired profile;

to make the size of the contact hole change stepwise.

Preferably, said first insulation film has a multilayer structure including an SOG (spin on glass) layer.

Preferably, a semiconductor device according to the invention is used for a liquid crystal apparatus comprising a plurality of pixel electrodes arranged to form an active matrix and provided with respective switching devices and liquid crystal held between said pixel electrodes and a common electrode disposed vis-a-vis semiconductor devices.

BRIEF DESCRIPTION OF THE DRAWINGS

FIGS. 9A, 9B and 9C are schematic illustrations of the optical system of the second embodiment of projection type liquid crystal display apparatus realized on the basis of the present invention.

FIGS. 10A, 10B and 10C are graphs showing the spectral reflection characteristics of the dichroic mirrors used for the optical system of the second embodiment of projection type liquid crystal display.

FIG. 21 is a schematic cross sectional view of the modified second embodiment of liquid crystal panel.

DETAILED DESCRIPTION OF THE PREFERRED EMBODIMENTS

The method of manufacturing a semiconductor device according to the invention will now be described in greater detail by referring to FIGS. 2A to 2J. The method of manufacturing a semiconductor device having a semiconductor substrate, a principal electrode mounted on the substrate and a contact hole is characterized in that said method comprises steps of:

(1) forming a coat of a first insulation film on the surface of the substrate;

(2) forming a coat of a first electroconductive film and patterning it to a desired profile;

(3) forming a coat of a second insulation film and patterning it to a desired profile, said first insulation film being simultaneously processed in a self-aligning manner relative to the patterned profile of said first electroconductive film within the region produced by removing said first electroconductive film in step (2) and located within the region being removed of the second insulation film;

(4) forming a coat of a third insulation film and forming a contact hole connected to said principal electrode of the semiconductor device within the region of said first insulation film processed in a self-aligning manner relative to the patterned profile of said first electroconductive film in said step (3); and (5) forming a coat of a second electroconductive film and patterning it to a desired profile;

to make the size of the contact hole change stepwise. With the above method, the caliber of a hole for electric connection can be made increase stepwise toward the top thereof.

As a result of a series of experiments conducted by the inventors of the present invention, it was proved that through holes can be buried excellently by using the above method so that a liquid crystal panel having a completely plane and smooth surface that is free from vestiges of through holes can be realized to display images with improved brightness and contrast by applying this method to prepare the semiconductor devices of the liquid crystal panel.

Now, the present invention will be described by way of embodiments of liquid crystal panels having a display region and a peripheral circuit region, although the present invention is not limited thereto and can be applied to improve the effect of burying electroconductive film in contact holes such as through holes (via holes) of semiconductor devices.

[Embodiment 1]

Figure 1:
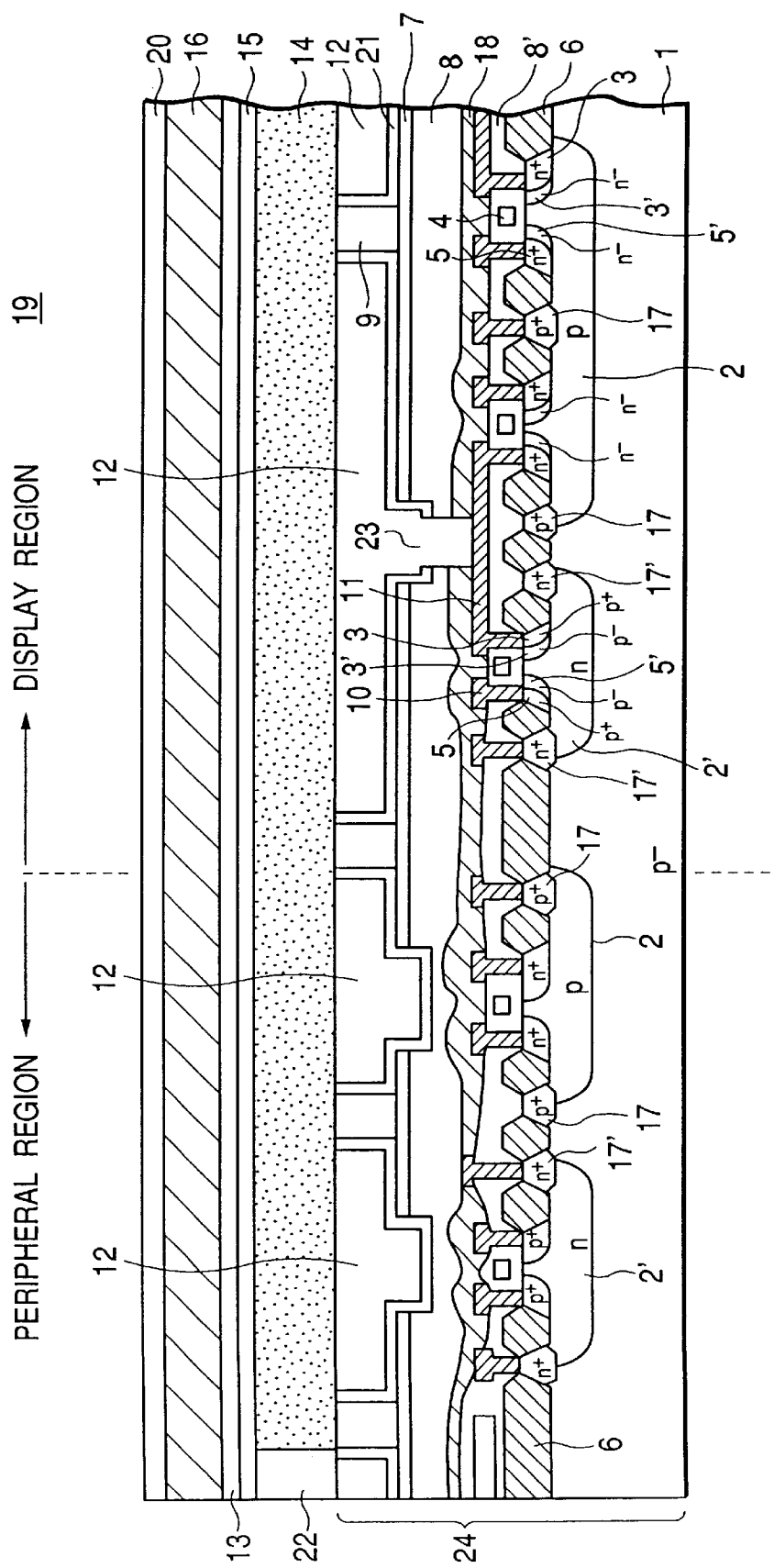
FIG. 1 is a schematic partial cross sectional view of a first embodiment of liquid crystal panel realized on the basis of the present invention.

FIG. 1 is a schematic cross sectional view of a liquid crystal panel according to the invention, showing a semiconductor substrate 1, p-type and n-type wells 2, 2', transistor source regions 3, 3', a transistor gate region 4 and transistor drain regions 5, 5' arranged for each semiconductor device.

Referring to FIG. 1, since a high voltage of 20V to 35V is applied to the transistors in the display region, the source/drain layer is not formed in a self-aligning manner but arranged with a certain degree of offset relative to the gate 4 so that a low concentration $n^-$ layer and a low concentration $p^-$ layer are formed respectively in the p-well and the n-well located therebetween as source region 31 and the drain region 5'. The offset is preferably between 0.5 μm and 2.0 μm. On the other hand, in part of the peripheral circuits shown in the left half of FIG. 1, a source/drain layer is formed in a self-aligning manner relative to the gate 4. Note that the peripheral circuits partly have a self-aligning structure because they are partly logic type circuits that are driven typically by 1.5 V to 5 V so that the source/drain layer can be formed in self-aligning manner to reduce the dimensions of the transistors and improve the efficiency of driving the transistors. While the offset of the source/drain layer is described above, the offset may be modified as a function of their withstand voltages and the gate length may be optimized to maximize the offset effect.

The substrate 1 is made of a p-type semiconductor and shows the lowest potential of the apparatus (normally the ground potential). A voltage for driving pixels, which is typically between 20V and 35V, is applied to the n-type wells in the display region, whereas a voltage for driving logics, which is typically between 1.5V and 5V, is applied to the logic sections of the peripheral circuits. With such an arrangement, the devices of the apparatus may be configured optimally in each region depending on the voltage applied thereto to consequently reduce the chip size and improve the speed of driving the pixels for displaying images.

Referring to FIG. 1, there are also shown a field oxide film 6, an insulation layer 8' typically made of PSG (phosphor glass), NSG (non-doped glass) or BPSG, source electrodes 10 to be connected to respective data wires, drain electrodes 11 to be connected to respective pixel electrodes, pixel electrodes 12 operating as so many reflectors, a shield layer 7 for covering areas not occupied by the pixel electrodes 12 preferably made of Ti, TiN or Mo or a multilayer material prepared by combining any of them. The shield layer 7 is formed not only in the display region but also in the peripheral circuit region in a same process typically by producing a film layer by vacuum evaporation or sputtering and subsequently patterning the film. Since the shield layer 7 covers substantially the entire surface of the chip, it shows an improved shielding effect against irradiation and can effectively prevent faulty operations of transistors due to stray light. As shown in FIG. 1, while the shield layer 7 covers transistors and other components except areas connecting the pixel electrodes 12 and the drain electrodes 11 in the display region, it is removed in areas of the peripheral region including part of the video lines and the clock lines where the wire capacitance shows an inappropriate large value. Since irradiated light can enter to a large extent to make the circuits operate faultily in areas where the shield layer 7 is removed, those areas are covered by the layer of the pixel electrodes 12.

In FIG. 1, reference numeral 8 denotes an insulation layer formed on a P—SiO layer 18 (an SiO layer formed by plasma CVD) which is subjected to a smoothing process using SOG (spin on glass). The planeness and the smoothness of the insulation layer 8 may be improved by covering the P—SiO layer 18 with plasma SiN. It may be needless to say that the smoothing process using an SOG can be replaced by a process of forming a P—TEOS (phosphotetraethoxysilane) film and covering it with a P—SiO layer, which is followed by a CMP process for smoothing the insulation layer 8.

Reference numeral 9 denotes another insulation layer arranged among the pixel electrodes 12 to satisfactorily separate the pixel electrodes from each other. The insulation layer 9 may preferably be made of P—SiO or P—SiN.

Reference numeral 21 denotes another insulation layer arranged between the reflection electrode 12 of each pixel and the shield layer 7 so that the charge retaining capacitance of the reflection electrodes 12 can be provided between the pixel electrode 12 and the shield layer 7 by way of this insulation layer 9. A film comprising P—SiN and/or $Ta_2O_5$ layers having a high dielectric constant may effectively be used for the insulation layer 21.

The shield layer 7, the insulation layer 9, the insulation layer 21 and the reflection electrodes 12 are formed in both the peripheral region and the display region 19 simultaneously through same and identical steps.

Otherwise, there are also shown a liquid crystal layer 14 of polymer network liquid crystal of a liquid crystal material such as PNLC or PDLC, a common transparent electrode 15 disposed opposite to the reflection electrodes 12, a transparent opposite substrate 16, a display region, an anti-reflection film 20 and a seal member 22 for securely holding the semiconductor substrate and the opposite substrate, which seal member 22 is used to control the gap separating the substrates. There are also shown high concentration impurity regions 17, 17'.

Reference numeral 13 denotes an anti-reflection film arranged between the common transparent electrode 15 and the opposite substrate 16 and designed to reduce the interface reflectivity by taking the refractive index of the liquid crystal into consideration. Then, the insulation film layer preferably shows a refractive index smaller than that of the opposite substrate 16 and that of the transparent electrode 15.

As shown in FIG. 1, the high concentration impurity regions 17, 17' having a polarity same as that of the wells 2, 2' and formed under the transistors are located in and on the peripheries of the wells 2, 2' so that, if a high frequency signal is applied to the sources of the transistors, they operate stably to produce high quality images because the potential of the wells are stably held to a desired low level by the low resistance layer. Additionally, said high concentration impurity regions 17, 17' are arranged between the n-type well 2' and the p-type well 2 with the field oxide film interposed therebetween to eliminate the use of a channel stop layer that is typically used for ordinary MOS transistors and arranged right under the field oxide film.

Since the high concentration impurity regions 17, 17' can be formed during the process of producing the source/drain layer, the overall number of masks and that of processing steps required for manufacturing the apparatus can be reduced to consequently reduce the manufacturing cost.

As shown in FIG. 1, the well region 2' is of the conductivity type opposite to that of the semiconductor substrate 1. Thus, the well region 2 of FIG. 1 is of the p-type. The p-type well region 2 and the n-type well region 2' are preferably implanted with an impurity to a concentration level higher than that of the semiconductor substrate 1. If the impurity concentration level of the semiconductor substrate 1 is $10^{14}$ to $10^{15}$ $cm^{-3}$, that of the well region 2 is preferably $10^{15}$ to $10^{17}$ $cm^{-3}$.

The source electrode 10 is connected to the corresponding data wire for transmitting display signals, while the drain electrode 11 is connected to the corresponding pixel electrode 12. The electrodes 10, 11 are typically made of wires of a material selected from Al, AlSi, AlSiCu, AlGeCu and AlCu. The electrodes 10, 11 provide a stable electric contact with semiconductor with a reduced contact resistance when a barrier metal layer of Ti and TiN is arranged on the lower surfaces thereof that contact with semiconductor. The pixel electrodes 12 preferably has a plane and smooth surface and shows a high reflectivity. Materials that can be used for preparing plane pixel electrodes 12 include Cr, Au and Ag as well as metals that are ordinarily used for wires such as Al, AlSi, AlSiCu, AlGeCu and AlCu.

In the final step of manufacturing a semiconductor device, the surfaces of the underlying insulation layer 9 and the pixel electrodes 12 are processed by CMP (chemical mechanical polishing).

Now, a method of preparing pixel electrodes including through holes (via holes) 23 for the purpose of the invention will be discussed in detail.

Figure 2A:
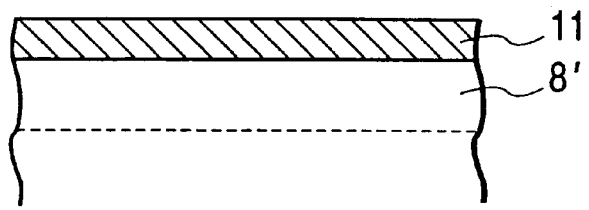
FIGS. 2A, 2B, 2C, 2D, 2E, 2F, 2G, 2H, 2I and 2J are schematic partial cross sectional views of the embodiment of FIG. 1, showing different manufacturing steps of the present invention.
Figure 2B:
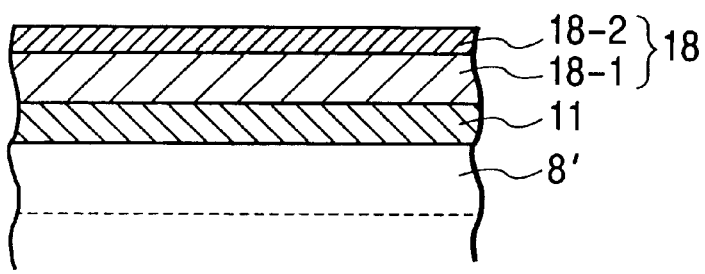

FIG. 2A shows a stage of operation where the drain electrode 11 has been formed on an insulation layer 8'. Then, as shown in FIG. 2B, a P—SiO layer 18-1 is deposited by plasma CVD to a thickness of 5,000 angstroms, which is then coated by SOG 18-2 twice by a thickness of 2,200 angstroms for each in an attempt to improve the surface flatness.

Figure 2C:
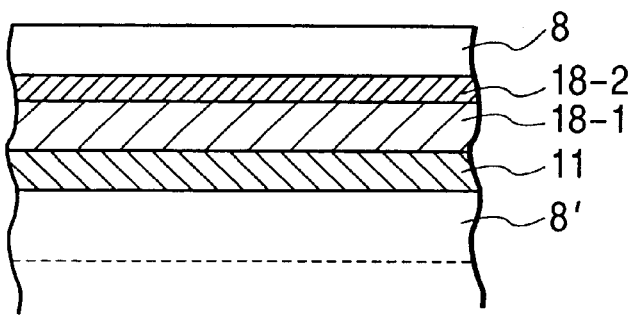

Subsequently in FIG. 2C, an insulation layer 8 of P—SiO is formed on the SOG by plasma CVD to a thickness of 4,000 angstroms. The insulation layer 8 may alternatively be formed by means of P—SiN and plasma CVD.

Figure 2D:
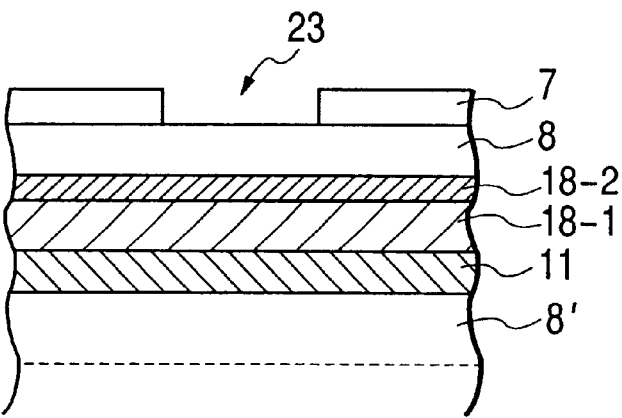

Then, in FIG. 2D, a shield layer 7 of Ti is deposited by sputtering to a thickness of 3,000 angstroms and then processed to show a desired profile so that the layer may be removed in the areas of through holes 23. The operation of processing the Ti layer include patterning the Ti layer by means of photoresist and removing the intended areas by means of an ECR plasma etching system using a mixture gas of $Cl_2/BCl_3$.

Figure 2E:
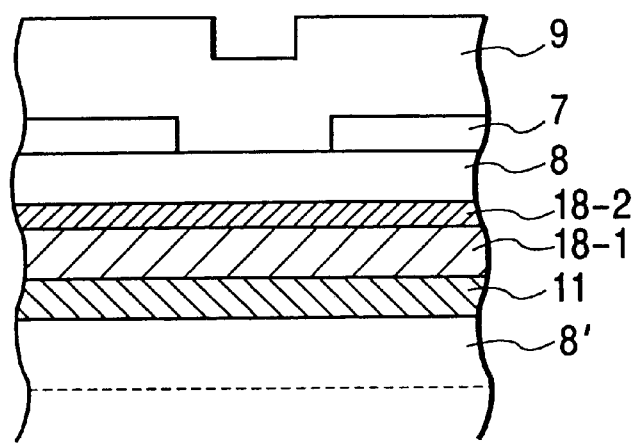

Then, in FIG. 2E, an insulation layer 9 is deposited to separate the pixel electrodes. The layer 9 is a P—SiO film layer produced by plasma CVD to a thickness of 14,000 angstroms. As pointed out above, the P—SiO film layer may be replaced by a P—SiN film layer.

Figure 2F:
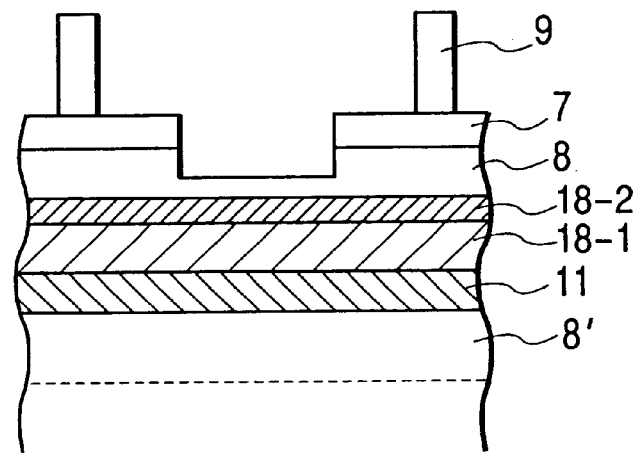

In FIG. 2F, the insulation layer 9 is processed to show a profile adapted to separate the pixel electrodes. Firstly, the film layer is subjected to a patterning operation using photoresist and then etched to show a desired profile by means of a diode parallel plate type plasma etching system using a mixture gas of $CF_4/Ar$ with a volume ratio of $CF_4/Ar=60/800$ cc and a high frequency power source of 380 kHz and 750 W under a processing pressure of 1.0 Torr so that a 10% over-etching may be realized. Under the above listed processing conditions, a selectivity ratio of 10 to 20 is secured for the insulation layer 9 and the shield layer 7 and the shield layer 7 operates as etching stopper layer. Thus, in the openings of the shield layer 7, the insulation layer 8 is etched in a self-aligning manner to the profile of the shield layer 7 by using the shield layer 7 as mask. As an over-etching ratio of 10% is selected for this operation, the insulation layer 8 will be etched by about 1,000 to 2,000 angstroms.

Figure 2G:
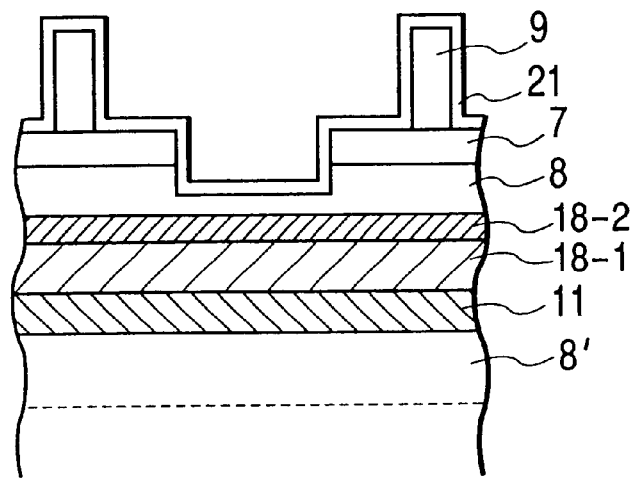

Subsequently, in step of FIG. 2G, another insulation 21 is deposited to provide a necessary capacitance for the shield layer 7. The insulation layer 21 is a P—SiN layer deposited to a film thickness of about 4,000 angstroms by plasma CVD. However, the layer may have a desired thickness depending on the switching performance of the device and the withstand voltage of the film. Therefore, the film thickness is not necessarily limited to 4,000 angstroms and a different material such as $Ta_2O_5$ may alternatively be used.

Figure 2H:
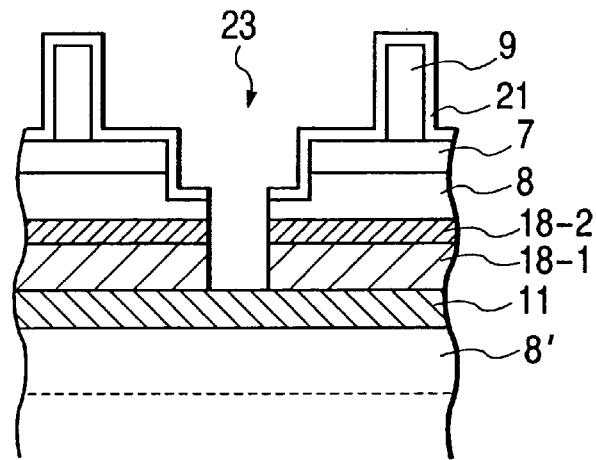

Then, in FIG. 2H, a through hole 23 is formed in area 23 to electrically connect the drain electrode 11 and the pixel electrode by a patterning operation using photoresist and an etching operation conducted in a diode parallel plate type plasma etching system using a mixture gas of $CF_4/CHF_3/Ar$.

Figure 2I:
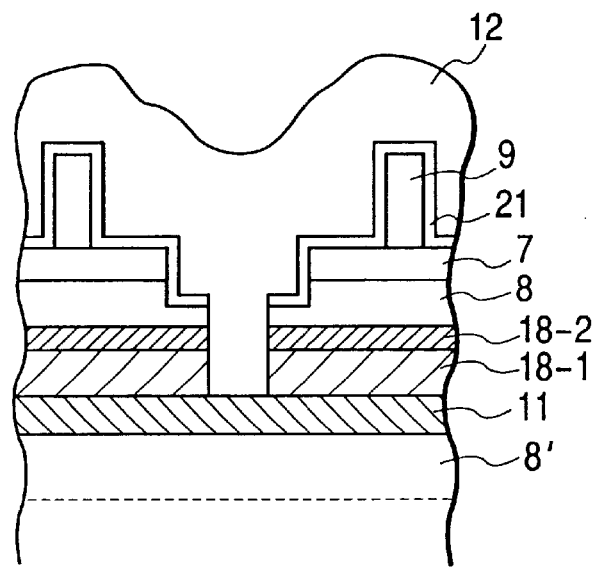
Figure 2J:
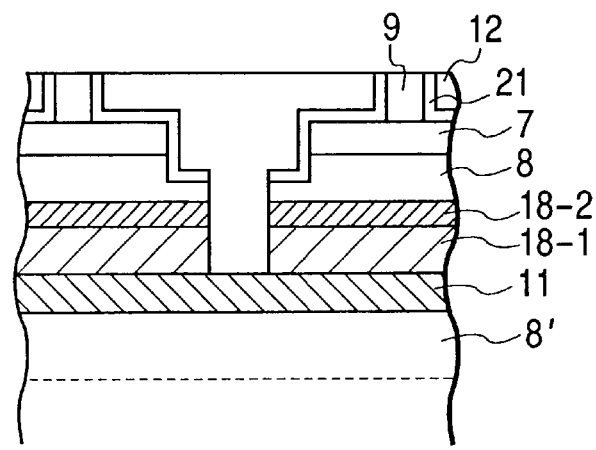

In FIG. 2I, a film is formed for the pixel electrodes 12 by depositing hot aluminum (Al) adapted to reflow. More specifically, firstly, TiN and Ti are deposited sequentially on the insulation film 21 to respective thicknesses of 2,000 angstroms and 300 angstroms by sputtering to prevent any reaction with Al and improve the reflowing behavior of the hot Al to be deposited thereon. Subsequently, Al is deposited to a thickness of 7,000 angstroms by sputtering without heating the wafer because, if hot Al is deposited directly on the films, the aluminum deposit comes to show an island-like profile. Finally, the wafer is heated to 425° C. and hot Al is deposited thereon to a thickness of 17,000 angstroms by sputtering, maintaining the wafer temperature to 425° C. for Al reflow until sometime after the end of the operation of depositing aluminum is over. While pixel electrodes 12 are produced through the above described process for this embodiment, it should be noted a different set of appropriate conditions can be selected for the process of preparing pixel electrodes 12 depending on the profile and the diameter of the through holes in view of the fact that the films constituting the pixel electrodes 12, the thickness of each of the films, the temperature of the wafer when hot Al is deposited thereon and the duration of time of maintaining the wafer to high temperature after depositing hot Al are among the essential factors of determining the reflow performance of the Al deposit and that the buriability of the through holes by reflow depends on the profile and the diameter of the through holes.

Now, referring to FIG. 2H, the through holes 23 show a stepped profile with the top having a diameter greater than the bottom because the insulation film 8 is etched in a self-aligning manner relative to the openings of the shield film 7. Thus, when a film is deposited in FIG. 2I for pixel electrodes 12, metal particles produced by sputtering can easily get to the bottom of the through holes to improve the buriability of the through holes and reduce the rate of appearance of defects including defective electric connections. As a result, the yield of manufacturing liquid crystal devices with a method according to the invention can be remarkably improved. Additionally, the stepped profile of the through holes also improves the reflow behavior of hot Al so that the through hole can be buried satisfactorily if hot Al is deposited to a relatively small thickness. Therefore, a perfectly smooth surface can be produced for the device without leaving any vestiges of the through holes when the surface is polished by CMP in FIG. 2J to separate the pixel electrodes. Additionally, since the thickness of the deposited film of the pixel electrodes 12 can be reduced, both the time required for the deposition and the time required for polishing the surface of the deposited film by CMP can be reduced to reduce the overall manufacturing cost. Still additionally, while a stepped profile of through holes having a top diameter greater than the bottom diameter cannot be produced with any known techniques for improving the buriability of the through holes without using an increased number of steps, such a stepped profile can be produced with a method according to the invention simply be utilizing the over-etching in FIG. 2F without entailing any additional cost.

As pointed out above, the stepped profile of through holes according to the invention is realized by utilizing the over-etching in FIG. 2F, when the insulation layer 9 is processed. While a 10% over-etching ratio is referred to in the above description of FIG. 2F, it may be needless to say that some other over-etching ratio may appropriately be selected depending on the stepped profile of the through holes to be produced.

Materials that can be used for the pixel electrodes 12 include Al, AlSi, AlSiCu, AlGeCu, AlCu, Cr, Au and Ag to be deposited by ordinary sputtering or vacuum evaporation particularly when the vestiges, if any, that are left after a CMP process are acceptable. Pixel electrodes made of any of such materials show a reliable electric performance due to an improved buriability.

Figure 4:
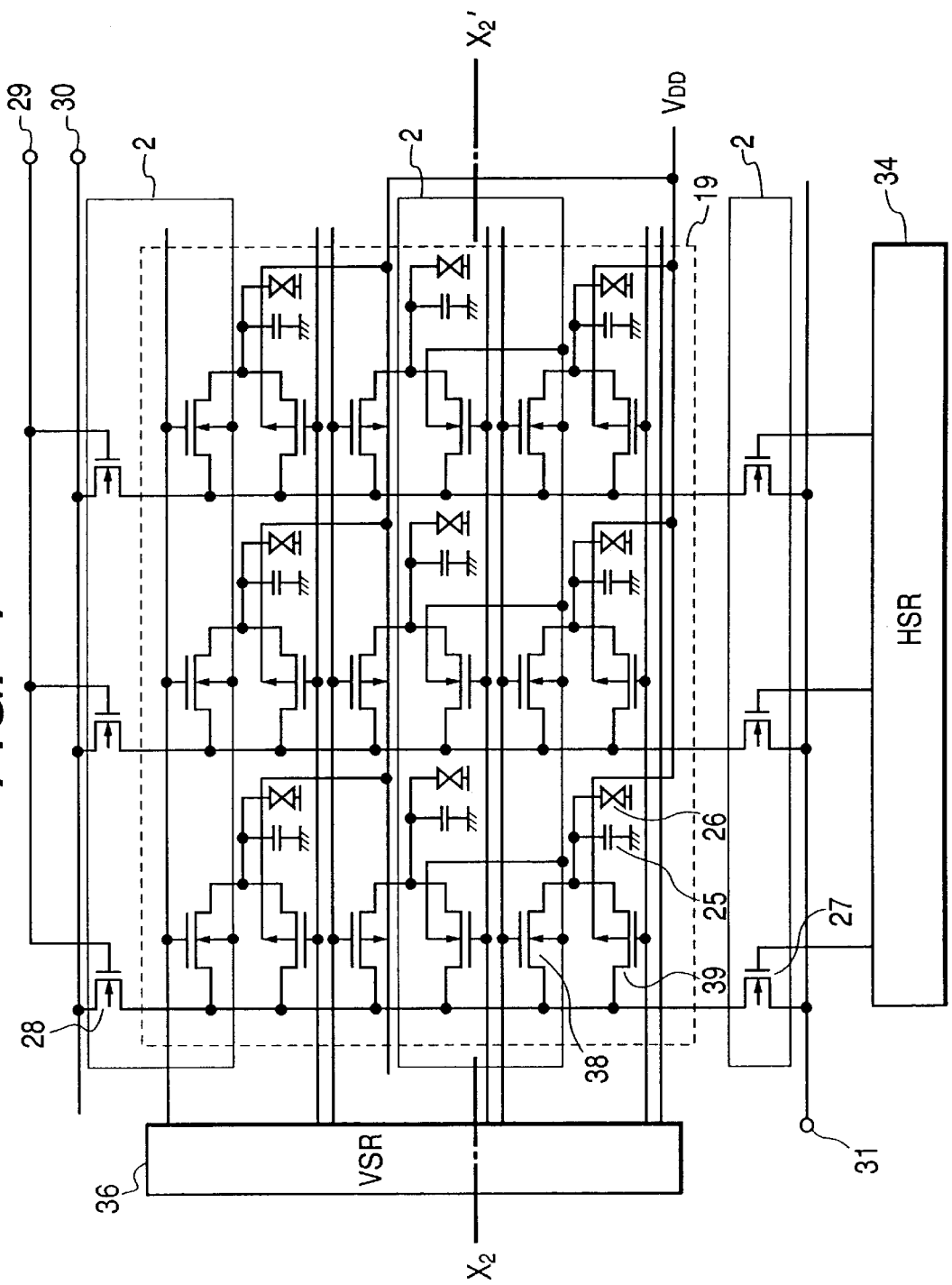
FIG. 4 is a schematic circuit diagram of the first embodiment of liquid crystal apparatus.

FIG. 4 is a schematic plan view of the semiconductor device section of a liquid crystal panel realized on the basis of the present invention. FIG. 4 shows a horizontal shift register (HSR) 34, a vertical shift register (VSR) 36, n-channel MOSFETs 38, p-channel MOSFETs 39, hold capacitances 25, a liquid crystal layer 26, signal transfers switches 27, reset switch FETs 28, a reset pulse input terminal 29, a reset power supply terminal 30 and a video signal input terminal 31. While the illustrated semiconductor substrate 1 is of the p-type, it may alternatively be of the n-type.

Each of the hold capacitances 25 is used to hold signals between the related pixel electrode 12 and the common transparent electrode 15. The substrate potential is applied to the well regions 2. In the transmission gates of this embodiment, n-channel MOSFETs 38 and p-channel MOSFETs 39 are arranged respectively high and low in the first row whereas p-channel MOSFETs 38 and n-channel MOSFETs 39 are arranged respectively high and low in the second row and so on in an alternating fashion. As described above, the pixel electrodes 12 are held in contact not only with the power supply lines at the stripe-type wells in the peripheral zone of the display region but also with fine power source lines arranged in the display region.

With such a circuit configuration, the key of stabilization lies in the resistance of the wells. Therefore, it is so arranged that, if a p-type substrate is used, n-type wells have a contact area or a number of contacts greater than the contact area or the number of contacts, whichever appropriate, of the p-type wells. Then, the p-type wells are secured for a predetermined potential by the p-type substrate, which operates as a low resistance member. While they may be affected to show a swinging potential by the input and output signals of the source/drains of the n-type wells arranged like islands, such a phenomenon can be prevented by increasing the contact area of the upper wiring layers to stably display high quality images.

Video signals (including proper video signals, pulse-modulated digital signals, etc.) are input through the video signal input terminal 31 and the signal transfer switches 27 are closed or opened according to the pulses from the horizontal shift register 34 to output the signals to the data wires. A high pulse is applied from the vertical shift register 36 to the gates of the n-channel MOSFETs 38 of the selected row, whereas a low pulse is applied from the vertical shift register 22 to the gates of the p-channel MOSFETs 39 of that row.

As described above, the switches of the pixel section are constituted by monocrystalline CMOS transmission gates so that signals to be written on the pixel electrodes are not restricted by the threshold value of the MOSFETs and the signals of the sources can be written without restrictions.

Figure 5:
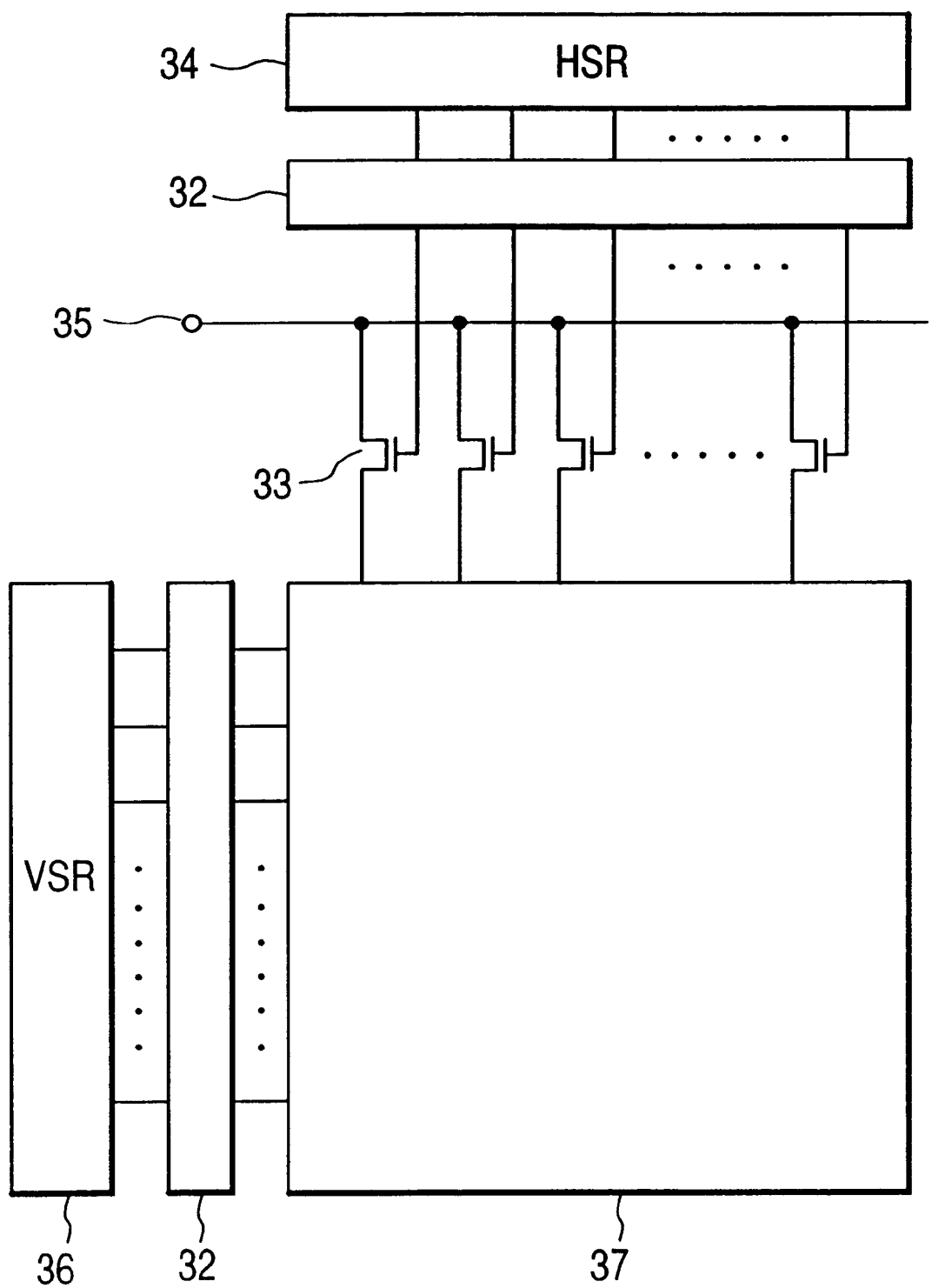
FIG. 5 is a schematic block diagram of the first embodiment of liquid crystal apparatus.

Additionally, since the switches of the pixel section are constituted by monocrystalline transistors, they do not show any instability in the operation that can occur along the crystal grain boundaries of polysilicon-TFTs and hence can show a highly reliable and quick drive effect. Now, the circuit configuration of the peripheral circuits of the panels will be described by referring to FIG. 5. In FIG. 5, there are shown a display region 37 of liquid crystal devices, a level shifter circuit 32, video signal sampling switches 33, a horizontal shift register 34, a video signal input terminal 35 and a vertical shift register 36.

With the above arrangement, the logic circuits including shift registers of both the horizontal shift register and the vertical shift register can be driven by a low voltage of about 1.5 V to 5 V regardless of the amplitude of the incoming video signal to realize a high speed and a low power consumption rate for operation. The horizontal and vertical shift registers can be driven for scanning operations bi-directionally by means of selection switches so that they can adapt themselves to positional rearrangements of the optical system and other modifications without modifying the panel. Thus, same and identical panels can be used for different product lines to reduce the manufacturing cost. While the video signal sampling switches of FIG. 5 are of a one-transistor type with one-side polarity, input video signals can accurately be written on the signal lines by using this embodiment comprising switches constituted by CMOS transmission gates in a manner as described above.

When using CMOS transmission gates for switches, they may be affected by the video signal to swing depending on the difference between the area of the NMOS gate and that of the PMOS gate and/or the difference in the overlapping capacitance of the gate and the source/drain. However, this problem can be avoided by connecting the source/drain of a MOSFET having a gate volume equal to about a ½ of the gate volume of the MOSFET of the sampling switch to a signal line for each polarity and by applying pulses with phases reversed relative to each other. With this arrangement, good video signals can be written on the signal lines to improve the quality of the displayed image.

Figure 6:
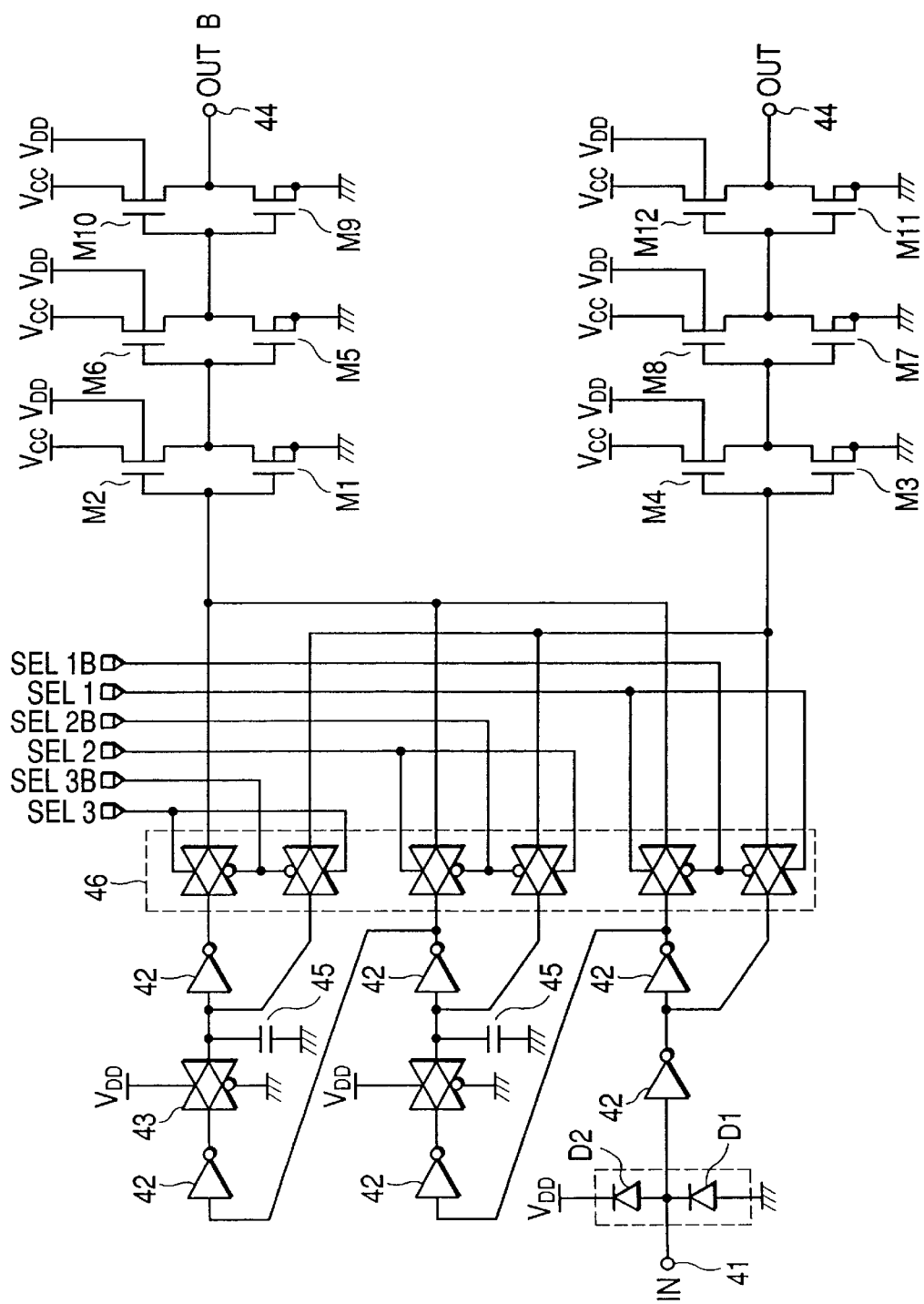
FIG. 6 is a schematic circuit diagram of part of the first embodiment of liquid crystal apparatus, including a delay circuit for the input section of the apparatus.

Now, a method of accurately synchronizing a video signal and a sampling pulse will be described by referring to FIG. 6. For synchronization, the amount of delay of the sampling pulse should be modified. In FIG. 6, reference numeral 42 denotes pulse delaying inverters and reference numeral 43 denotes switches for selecting a delaying inverter, whereas reference numeral 44 denotes outputs having a controlled amount of delay (outB is for outputs with the reversed phase and outA is for outputs with the original phase) and reference numeral 45 denotes capacitances. Reference numeral 46 denotes a protection circuit.

The number of delaying inverters 42 to be passed through can be determined by combining SEL1 (SEL1B) through SEL3 (SEL3B) appropriately.

When the panels of R, G and B comprise this synchronizing circuit and the amounts of delay of externally applied pulses have lost the symmetry for some reasons, for example, attributable to the jigs involved, they can be regulated by means of the selection switches SEL to produce high quality images without color separation caused by phase shifts of R, G and B pulses. It may be effective to arrange temperature sensing diodes in the inside of the panels for temperature corrections to be realized by means of their outputs, referring to a table of amounts of delay.

Now, the liquid crystal material will be discussed. The panel of FIG. 1 has a pair of flat and oppositely disposed substrates and the common electrode substrate 16 has undulations on the surface in order to prevent reflections at the interface with the common transparent electrode 15 that is carried on the surface. An anti-reflection film 20 is arranged on the other surface of the common electrode substrate 16. The substrate may be ground with fine grinding grains to produce undulations that can improve the contract of the displayed image.

Polymer network liquid crystal PNLC is used for the liquid crystal of the panels. The polymer network liquid crystal may be PDLC (polymer dispersed liquid crystal) for the purpose of the invention. Polymer network liquid crystal PNLC is prepared typically by a polymerization phase separation technique. With this technique, a solution of liquid crystal and polymerizing monomer or oligomer is prepared and poured into a cell, where the liquid crystal and the polymer are phase separated by UV polymerization to produce a network of polymer in the liquid crystal. PNLC contains liquid crystal to a large extent (70 wt % to 90 wt %).

If nematic liquid crystal that is refractively highly anisotropic (Δn) is used, the PNLC will intensely scatter light. If, on the other hand, nematic liquid crystal that is dielectrically highly anisotropic (Δ∈) is used, the PNLC will be driven with low voltage. The light scattering effect of a polymer network will be sufficiently high for achieving a good contrast when the centers of the meshes of the network are separated by a distance between 1 µm and 1.5 µm.

Figure 7:
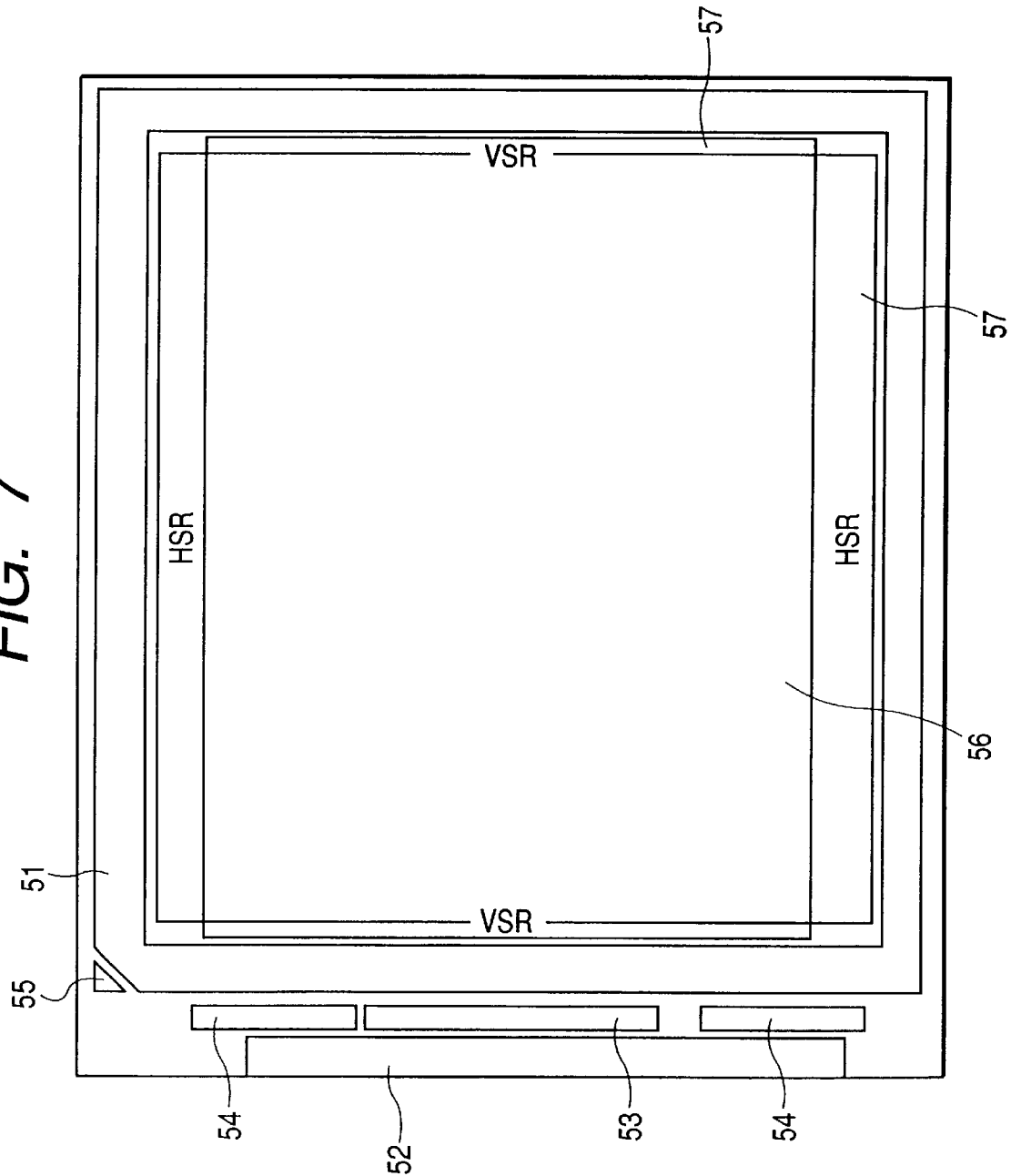
FIG. 7 is a schematic plan view of a liquid crystal panel that can be used for both the first and second embodiments of liquid crystal apparatus realized on the basis of the present invention.

Now, the relationship of the sealing arrangement and the structure of the panels will be described by referring to FIG. 7. In FIG. 7, there are shown a seal section 51, an electrode pad 52, a clock buffer circuit 53 and an amplifier 54. The amplifier 54 is provided and used as output amplifier for electrically testing the panels. There is also provided an Ag paste section (not shown) for providing the opposite substrate with a given potential. Reference numeral 56 denotes the display section of the panels comprising liquid crystal devices and reference numeral 57 denotes the peripheral circuit section including horizontal and vertical shift registers (HSR, VSR) to be used for the display section 56. As shown in FIG. 7, circuits are arranged outside the seal section of this embodiment in order to reduce the total chip size. While only a single pad section is arranged along an edge of the panels, wires may be drawn out from the inside of the panels by way of a plurality of pads arranged along more than one edges of the panels. Such a multi-edge arrangement will be advantageous for handling high speed clocks.

The substrate potential of the panels of this embodiment comprising semiconductor substrates such as Si substrates can fluctuate to cause the panels to operate erroneously when the lateral walls of the panels are irradiated with light intensely. Therefore, a substrate holder having a shield effect is arranged to cover the lateral walls of the panels and the peripheral circuit section surrounding the display region on the front side of the panels, whereas the rear surfaces of the Si substrates are covered by a holder, to which metal components including those made of Cu and showing a high thermal conductivity are connected by way of adhesive also showing a high thermal conductivity.

Figure 3:
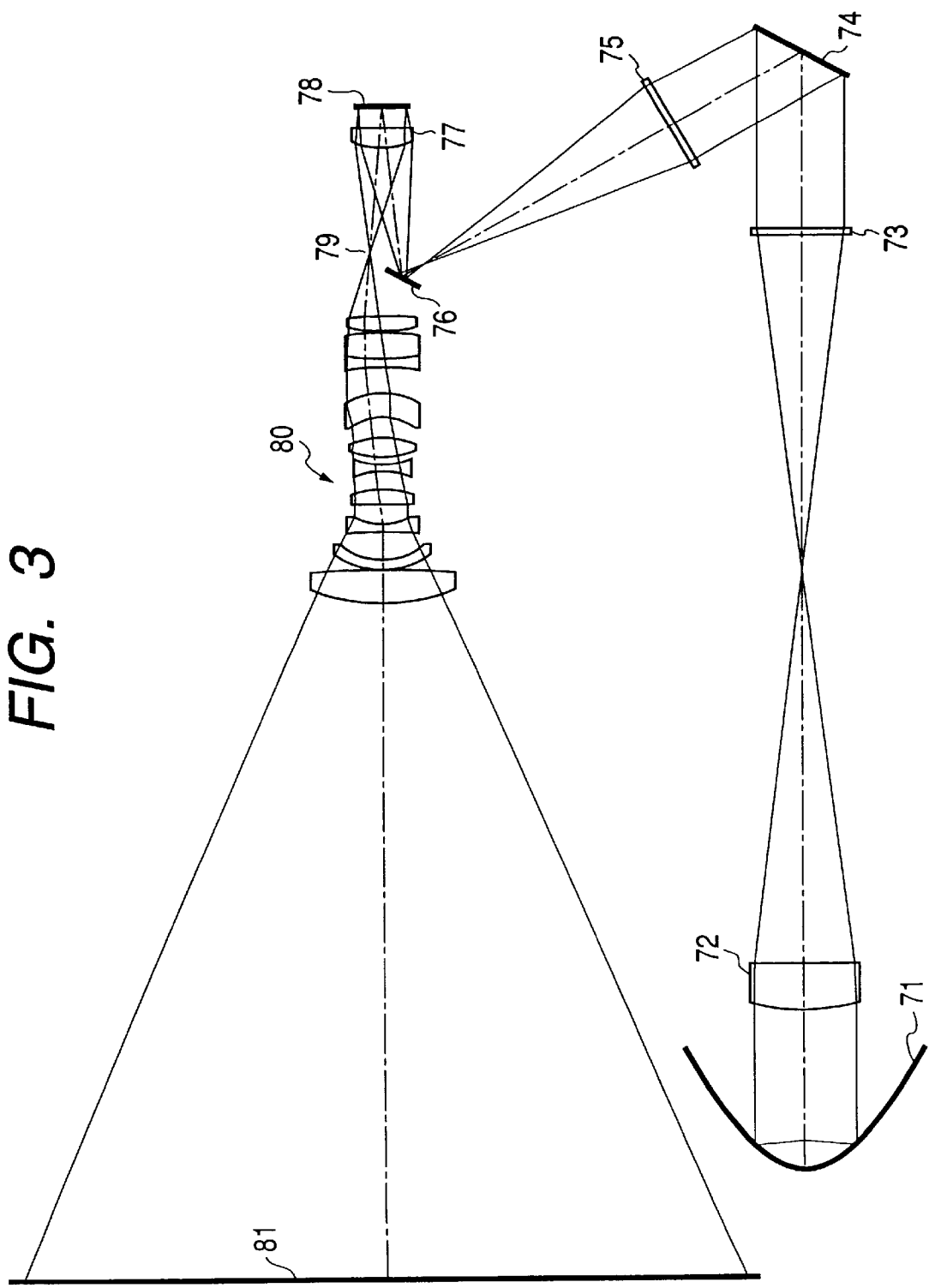
FIG. 3 is a schematic illustration of a first embodiment of liquid crystal projector realized on the basis of the present invention, showing the underlying concept.

Now, an optical system to which reflection type liquid crystal panels according to the invention are incorporated will be described by referring to FIG. 3. Referring to FIG. 3, there are shown a light source 71 which may be a halogen lamp, a condenser 72 for converging rays of light coming from the light source, a pair of plane convex Fresnel lenses 73, 75, a color separating optical device 74 for separating light into R, G and B, which may advantageously be a dichroic mirror or a diffraction grating.

There are also shown a mirror unit 76 for leading separated R, G and B lights respectively to R, G and B panels, a finder lens 77 for collimating convergent rays of light before illuminating the reflection type liquid crystal panel, a reflection type liquid crystal device 78 having an LCD panel unit arranged at a predetermined position as described above by referring to the first through third embodiments and a diaphragm section 79. Additionally, there are also shown a projection lens 80 realized by combining a plurality of lens to operate as magnifier and a screen 81 that can display clear, bright and contrast images when constituted by a Fresnel lens for collimating projected light and a lenticular lens for providing a wide viewing angle both vertically and horizontally. Note that, while FIG. 3 illustrates only a single panel for a single color, rays of light of three separated colors proceeds between the color separating optical device 74 and the diaphragm section 79 and actually three panels are required.

As a voltage is applied to the liquid crystal layer of the liquid crystal device, rays of light reflected by the pixels passes the diaphragm section 79 before they are projected onto the screen.

While no voltage is applied and the liquid crystal is a scattering body, rays of light entering the reflection type liquid crystal device are scattered isotropically so that only scattered rays of light directed to the aperture of the diaphragm section 79 can enter the projection lens. Only black will be displayed under this condition. As will be understood from the above description on the optical system, no polarization panel is required for the system. Additionally, since signal light is reflected by the entire surface of the pixel electrode before entering the projection lens, this arrangement can display an image brighter by two to three times than any comparable conventional arrangement. As described above, anti-reflection measures are taken on the surface and the interface of the opposite substrate so that noise factors are minimized for light and contrasty images can be displayed on the screen. Additionally, all the optical devices (lenses, mirrors, etc.) can be down-sized to reduce the cost and the weight because a small panel can be used.

Shadings and fluctuations of light and color of the light source can be prevented from being reflected on the screen by arranging an integrator (fly eye lens type, rod type) between the light source and the optical system.

Figure 8:
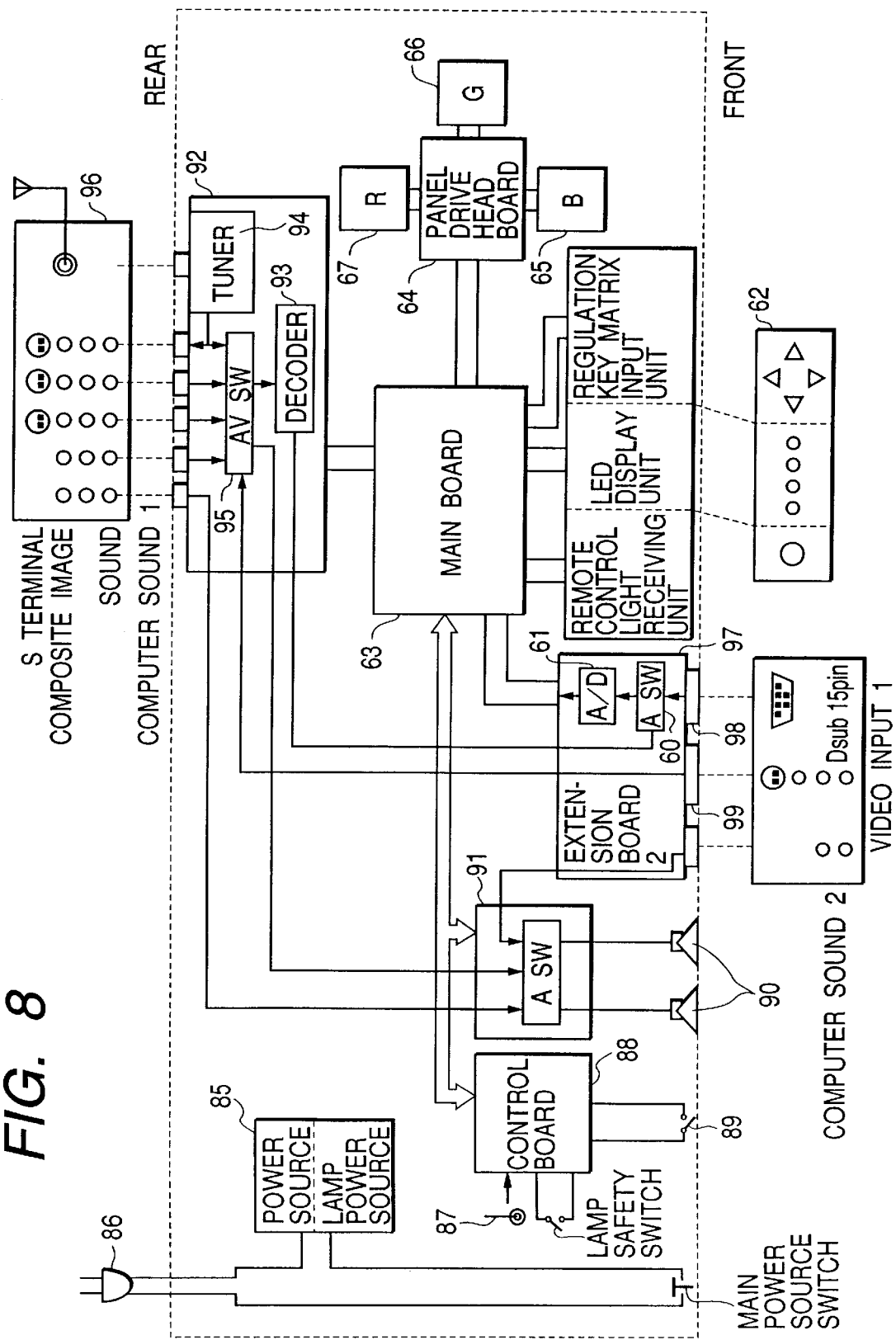
FIG. 8 is a schematic circuit block diagram of a liquid crystal projector, showing its internal arrangement.

Now, the peripheral electric circuits other than the liquid crystal panel will be described by referring to FIG. 8. In FIG. 8, there are shown a bipartite power source 85 for supplying power to the lamps and also to the drive system for driving the panels and the signal processing circuit, a plug 86 and a lamp temperature sensor 87 adapted to cause the control board 88 to deenergize any lamps whose temperature is detected to be abnormal. The filter safety switch 89 is also controlled by the control board 88. For example, if the lamp house box show high temperature, the box cannot be opened by way of precaution. Reference numeral 90 denotes a loudspeaker and reference numeral 91 denotes a sound board that can contain a processor for 3D sounds and surround sounds if required. Reference numeral 92 denotes extension board 1 having input terminals for receiving signals from S terminals and other external sources 96 of signals for composite images and sounds, a selection switch 95 for selecting a signal and a tuner 94. Signals are sent from there to extension board 2 by way of a decoder 93. The extension board 2 has Dsub15 pin terminals to be connected to external video signal sources and computers and signals are converted into digital signals by an A/D converter 61 by way of a switch 60 for selecting the video signal from the decoder 93.

Reference numeral 63 denotes a main board comprising a CPU and memories including a video RAM as principal components. The NTSC signals subjected to A/D conversion by the A/D converter 61 are temporarily stored in a memory and additional signals are generated by interpolation for vacant liquid crystal elements to satisfactorily assign signals to the large number of pixels for high definition, while other signal processing operations proceed, including gamma conversion edge gradation, brightness adjustment and bias adjustment. If high resolution XGA panels are used and computer signals such as VGA signals are applied in stead of NTSC signals, a resolution conversion processing operation will also be conducted on the main board. The main board 63 also operate for synthetically combining NTSC signals of data not only for a single image but also for a plurality of images with computer signals. The output of the main board 63 is subjected to a serial/parallel conversion and applied to the head board 64 in a form less adversely affected by noises. The head board 64 operates for carrying out a parallel/serial conversion and a D/A conversion for the output signal, which is divided according to the number of video lines of the panels and the signal is written onto the liquid crystal panels 65, 66 and 67 of B, G and R by means of respective drive amplifiers.

Reference numeral 62 denotes a remote control panel with which computer images can be manipulated like TV images. The liquid crystal panels 65, 66 and 67 have an identical configuration that are same as the liquid crystal (LCD) panels described above for each of the first through third embodiments and provided with respective color filters of the corresponding colors. As described above, this embodiment of display apparatus can display neat and clear images.

[Embodiment 2]

While the first embodiment is a reflection type liquid crystal display apparatus of a so-called three-panel type comprising three liquid crystal panels to be irradiated with R, G and B lights respectively and images are displayed on the screen by means of light reflected by the panels.

On the other hand, this second embodiment is a liquid crystal display apparatus of a so-called single-panel type comprising only a single panel to be irradiated with R, G and B lights and images are displayed on the screen by means of light reflected by the single panel.

Figure 11:
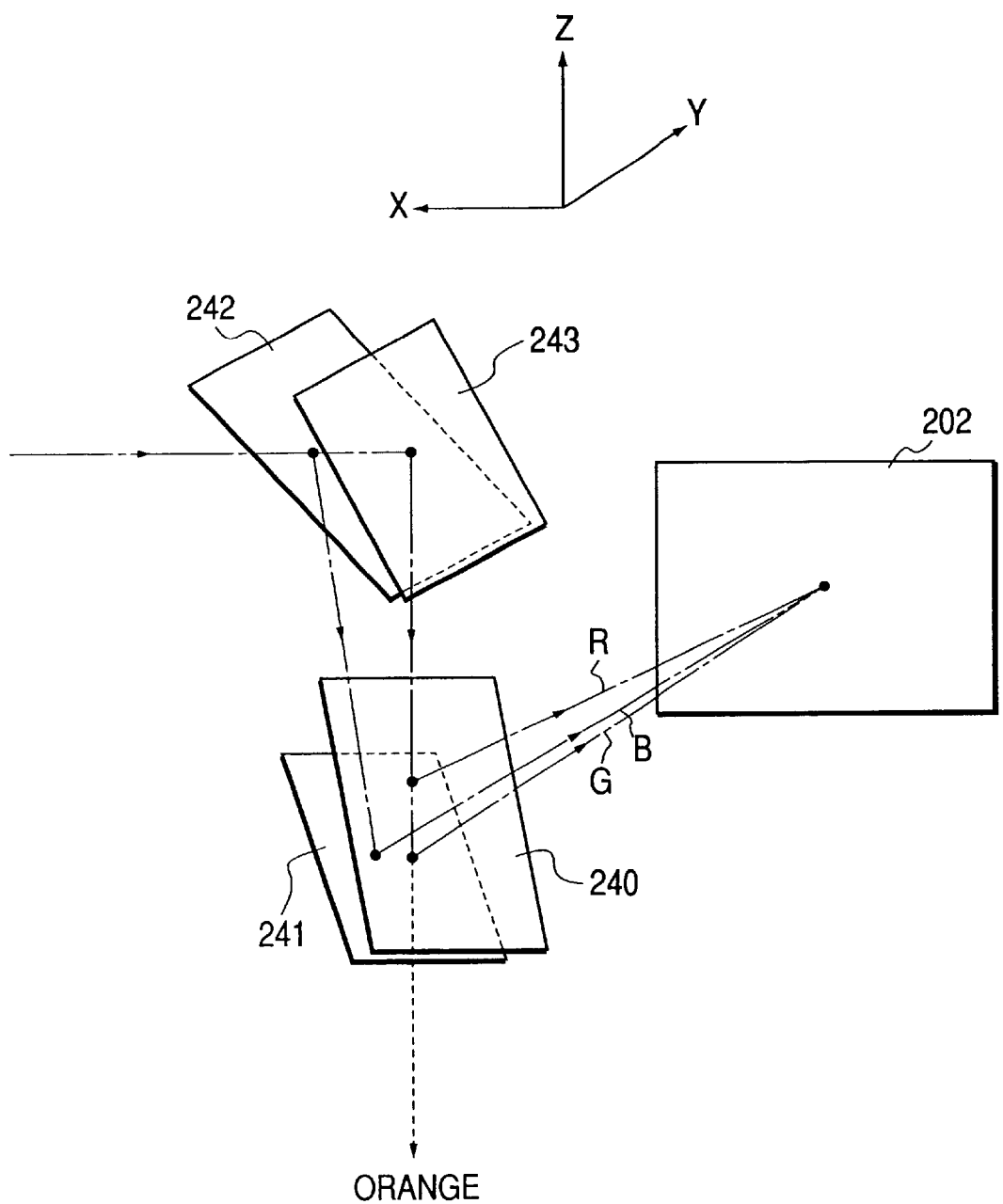
FIG. 11 is a schematic perspective view of the color separation illumination section of the optical system of the second embodiment of projection type liquid crystal display apparatus.

FIGS. 9A, 9B and 9C are schematic illustrations of an embodiment of the optical system of a front and back projection type liquid crystal display apparatus according to the invention. FIG. 9A shows a plan view, FIG. 9B shows a front view and FIG. 9C shows a side view. Referring to FIGS. 9A to 9C, there are shown a projection lens 201 for projecting an image on the screen, a liquid crystal panel 202 having micro-lenses, a polarization beam splitter (PBS) 203, an R (red light) reflecting dichroic mirror 240, a B/G (blue and green light) reflecting dichroic mirror 241, a B (blue light) reflecting dichroic mirror 242, a white light reflecting high reflection mirror 243, a Fresnel lens 250, a convex lens 251, a rod type integrator 206, an elliptic reflector 207, an arc lamp 208 of, for example, metal halide or UHP. Note that the R (red light) reflecting dichroic mirror 240, the B/G (blue and green light) reflecting dichroic mirror 241 and the B (blue light) reflecting dichroic mirror 242 have respective spectrum reflection characteristics illustrated in FIGS. 10A to 10C. The dichroic mirrors and the high reflection mirror 243 are three-dimensionally arranged as shown in the perspective view of FIG. 11 to divide illuminated white light and separate R, G and B light as will be described hereinafter and cause rays of light of the three primary colors to irradiate the liquid crystal panel 202 with respective angles that are three-dimensionally different from each other.

The operation of the optical system will be described in terms of the proceeding route of a flux of light. Firstly, the flux of light emitted from the lamp 208 of the light source of the system is that of white light and converged by the elliptic reflector 207 toward the inlet port of the integrator 206 arranged in front of it. As the flux of light proceeds through the integrator 206 with repeated reflections, the spatial intensity distribution of the flux of light is uniformized. After coming out of the integrator 206, the flux of light is collimated along the x-direction (as shown in the front view of FIG. 9B) by the convex lens 251 and the Fresnel lens 250 before getting to the B reflecting dichroic mirror 242. Only B light (blue light) is reflected by the B reflecting dichroic mirror 242 and directed to the R reflecting dichroic mirror 240 along the z-axis or downwardly of FIG. 9B, showing a predetermined angle relative to the z-axis. Meanwhile, light other than B light (R/G light) passes through the B reflecting dichroic mirror 242 and reflected rectangularly by the high reflection mirror 243 into the direction of the z-axis (downwardly) and also directed to the R reflecting dichroic mirror 240. Referring to the front view of FIG. 9A, both the B reflecting dichroic mirror 242 and the high reflection mirror 243 are arranged to reflect the flux of light coming from the integrator 206 (along the direction of the x-axis) into the direction of the z-axis (downwardly), the high reflection mirror 243 being tilted around the axis of rotation, or the y-axis, exactly by 45° relative to the x-y plane. On the other hand, the B reflecting dichroic mirror 242 is tilted around the axis of rotation, or the y-axis, by an angle less than 45° relative to the x-y plane. Thus, while R/G light reflected by the high reflection mirror 243 is directed rectangularly toward the z-axis, B light reflected by the B reflecting dichroic mirror 242 is directed downwardly, showing a predetermined angle relative to the z-axis (tilted in the x-z plane). Note that the extent of shifting the high reflection mirror 243 and the B reflecting dichroic mirror 242 relative to each other and the angle of tilt of the B reflecting dichroic mirror will be so selected that the principal beams of light of the three primary colors intersect each other on the liquid crystal panel 202 in order to make B light and R/B light show an identical coverage on the liquid crystal panel 202.

The downwardly directed fluxes of R/G/B light (along the z-axis) then proceeds to the R reflecting dichroic mirror 240 and the B/G reflecting dichroic mirror 241, which are located below the B reflecting dichroic mirror 242 and the high reflection mirror 243. The B/G reflecting dichroic mirror 241 is tilted around the axis of rotation, or the x-axis by 45° relative to the x-z plane, whereas the R reflecting dichroic mirror 240 is tilted around the axis of rotation, or the x-axis, by an angle less than 45° relative to the x-z plane. Thus, of the incoming fluxes of R/G/B light, those of B/G light firstly pass through the R reflecting dichroic mirror 240 and reflected rectangularly by the B/G reflecting dichroic mirror 241 into the positive direction of the y-axis before they are polarized and illuminate the liquid crystal panel 202 arranged horizontally on the x-z plane. Of the fluxes of B/G light, that of B light shows a predetermined angle relative to the x-axis (tilted in the x-z plane) as described above (see FIGS. 9A and 9B) so that, after having been reflected by the B/G reflecting dichroic mirror 241, it maintains the predetermined angle relative to the y-axis (tilted in the x-y plane) and illuminates the liquid crystal panel 202 with an angle of incidence equal to the predetermined angle (relative to the x-y plane). On the other hand, the flux of G light is reflected rectangularly by the B/G reflecting dichroic mirror 241 and proceeds into the positive direction of the y-axis before it is polarized and hits the liquid crystal panel 202 perpendicularly with an angle of incidence of 0°. The flux of R light is reflected by the R reflecting dichroic mirror 240 which is arranged upstream relative to the B/G reflecting dichroic mirror 241 as pointed out above into the positive direction of the y-axis and proceeds along the positive direction of the y-axis, showing a predetermined angle relative to the y-axis (titled in the y-z plane) as shown in FIG. 9C (lateral view) before it is polarized by the PBS 203 and hits the liquid crystal panel 202 with an angle incidence equal to the predetermined angle (relative to the y-z plane). As pointed out above, the extent of shifting the B/G reflecting dichroic mirror 241 and the R reflecting dichroic mirror 240 relative to each other and the angle of tilt of the R reflecting dichroic mirror will be so selected that the principal beams of light of the three primary colors intersect each other on the liquid crystal panel 202 in order to make the fluxes of R/G/B light show an identical coverage on the liquid crystal panel 202. As shown in FIGS. 10A, 10B and 10C, the cutting frequency of the B reflecting dichroic mirror 242 is 480 nm and that of the B/G reflecting dichroic mirror 241 is 570 nm, whereas that of the R reflecting dichroic mirror 240 is 600 nm. Thus, unnecessary orange light is discarded after passing through the B/G reflecting dichroic mirror 241 to realize an optimal color balance.

As described in greater detail hereinafter, rays of R/G/B light are reflected and polarized for modulation by the liquid crystal panel 202 and return to the PBS 203, where the fluxes reflected into the positive direction of the x-axis by the PBS plane 203a of the PBS 203 are used as light for producing enlarged and projected images on the screen (not shown) by way of the projection lens 201. Since the fluxes of R/G/B light striking the liquid crystal panel 202 have w respective angles of incidence that are different from each other, the fluxes of light reflected by it and coming out therefrom shows respective angles that are also different from each other. However, the projection lens 201 has a lens diameter and an aperture that are large enough for accommodating the differences. Note that the fluxes of light striking the projection lens 201 are collimated as they pass through the micro-lens array twice per each to maintain a predetermined angle for striking the liquid crystal panel 202.

Thus, with this embodiment, the expansion of the flux of light coming from the liquid crystal panel 2 is relatively limited so that a sufficiently bright image can be projected on the screen by using a less costly projection lens having a relatively small numerical aperture.

Figure 12:
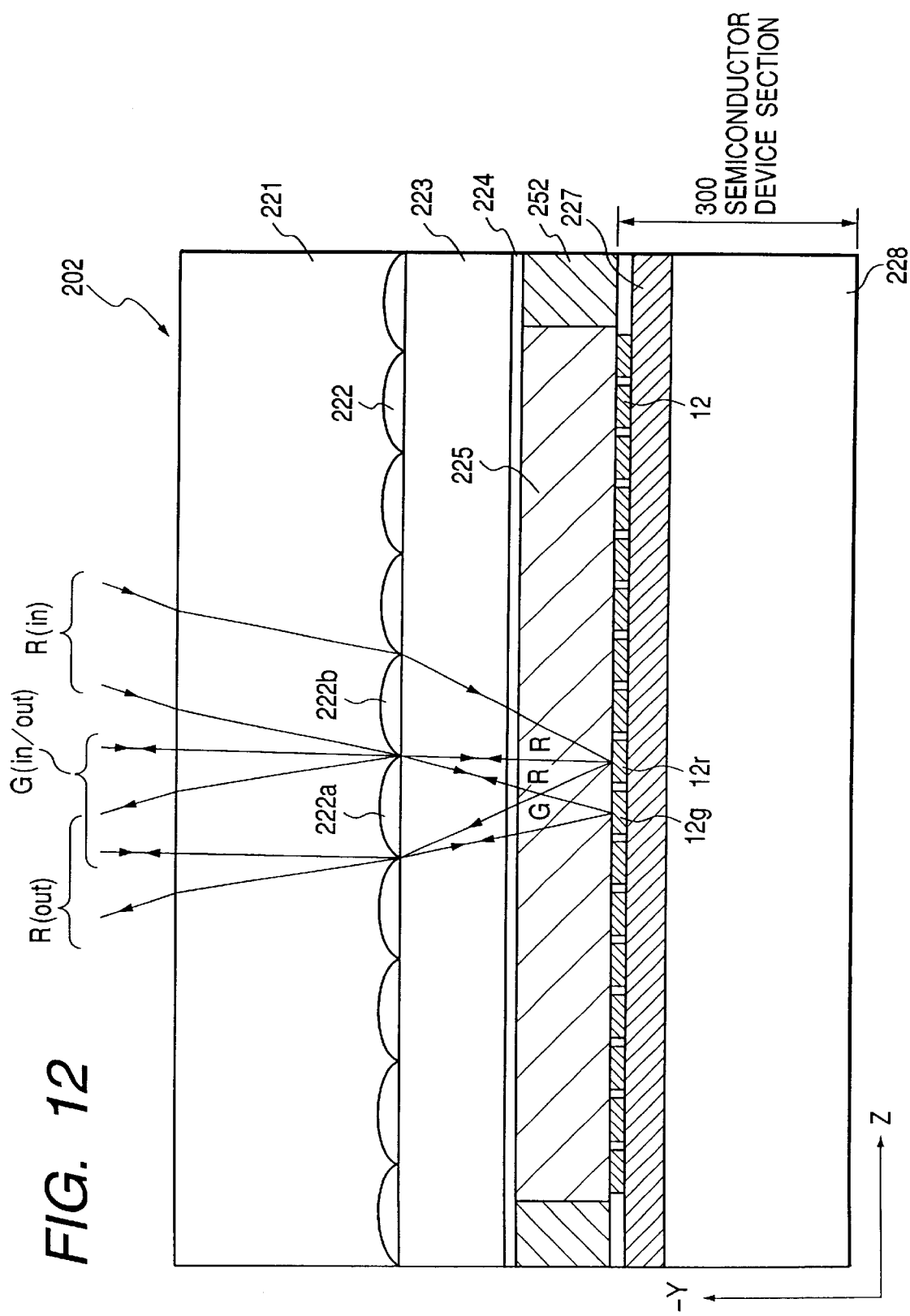
FIG. 12 is a schematic cross sectional view of the second embodiment of liquid crystal panel.

Now, the liquid crystal panel 202 of this embodiment will be described. FIG. 12 is an enlarged schematic cross sectional view of the liquid crystal panel 202 (taken along the y-z plane of FIG. 9C). Referring to FIG. 12, there are shown a micro-lens substrate 221, a number of micro-lenses 222, a sheet of glass 223, a transparent opposite electrode 224, a liquid crystal layer 225, a number of pixel electrodes 12, an active matrix drive circuit 227 and a silicon semiconductor substrate 228. Reference numeral 252 denotes a peripheral seal section. The micro-lenses 222 are formed on the surface of a glass substrate (alkali glass) 221 by means of a so-called ion-exchange technique and arranged in two-dimensional array at a pitch twice as high as that of the pixel electrodes 12. ECB (electrically controlled birefringence) mode nematic liquid crystal such as DAP (deformation of aligned phase) or HAN (hybrid aligned nematic) that is adapted to a reflection type display is used for the liquid crystal layer 225 and a predetermined orientation is maintained by means of an orientation layer (not shown). The pixel electrodes 12 are made of aluminum and operate as reflector. Therefore, they are processed by a so-called CMP treatment technique after the patterning operation in order to improve the smoothness and the reflectivity of the surface. The active matrix drive circuit 227 is a semiconductor circuit arranged on the silicon semiconductor substrate 228 to drive the pixel electrodes 12 in an active matrix drive mode. Thus, gate line drivers (vertical registers, etc.) and signal line drivers (horizontal registers, etc.) (not shown) are arranged in the peripheral area of the circuit matrix (as will be discussed in detail hereinafter). The peripheral drivers and the active matrix drive circuit are so arranged as to write primary color video signals of RGB on the respective RGB pixels in a predetermined fashion. Although the pixel electrodes 12 are not provided with color filters, they are identified respectively as RGB pixels by the primary color image signals to be written onto them by said active matrix drive circuit as they are arranged in array.

Take, for example, rays of G light that illuminate the liquid crystal panel 202. As described above, G light is polarized by the PBS 203 and then perpendicularly strikes the liquid crystal panel 202. FIG. 12 shows a beam of G light that enters the micro-lens 222a in a manner as indicated by arrow G (in/out). As shown, the beam of G light is converged by the micro-lens 222 to illuminate the surface of the G pixel electrode 12g before it is reflected by the aluminum-made pixel electrode 12g and goes out of the panel through the same micro-lens 222a. As the beam of G light (polarized light) moves through the liquid crystal layer 225, it is modulated by the electric field generated between the pixel electrode 12g and the opposite electrode 224 by the signal voltage applied to the pixel electrode 12g before it returns to the PBS 203. Thus, the quantity of light reflected by the PBS surface 203a and directed to the projection lens 201 changes depending on the extent of modulation to define the gradation of the related pixel. On the other hand, R light enters the cross sectional plane (the y-z plane) of FIG. 12 slantly in a manner as described above after having been polarized by the PBS 203. Take, now, a beam of R light striking the micro-lens 222b. It is converged by the micro-lens 222b in a manner as indicated by arrow R (in) in FIG. 12 to illuminate the surface of the R pixel electrode 12r located at a position shifted to the left in FIG. 12 from the spot right below it before it is reflected by the pixel electrode 12r and goes out of the panel through the adjacently located micro-lens 222a (in the negative direction of the z-axis) (R(out)). As in the case of G light described above, as the beam of R light (polarized light) moves through the liquid crystal layer, it is modulated by the electric field generated between the pixel electrode 12r and the opposite electrode 224 by the signal voltage applied to the pixel electrode 12r before it goes out of the liquid crystal panel and returns to the PBS 203. Then, as described above in terms of G light, light from the pixel is projected through the projection lens 201. While the beams of G light and R light on the pixel electrodes 12g and 12r may appear overlapping and interfering with each other in FIG. 12, it is because the liquid crystal layer is shown excessively thick, although it has a thickness between 1 $\mu$m and 5 $\mu$m in reality, which is very small if compared with the sheet glass 223 having a thickness between 50 $\mu$m and 100 $\mu$m so that no such interference actually takes place regardless of the size of each pixel.

Figure 13A:
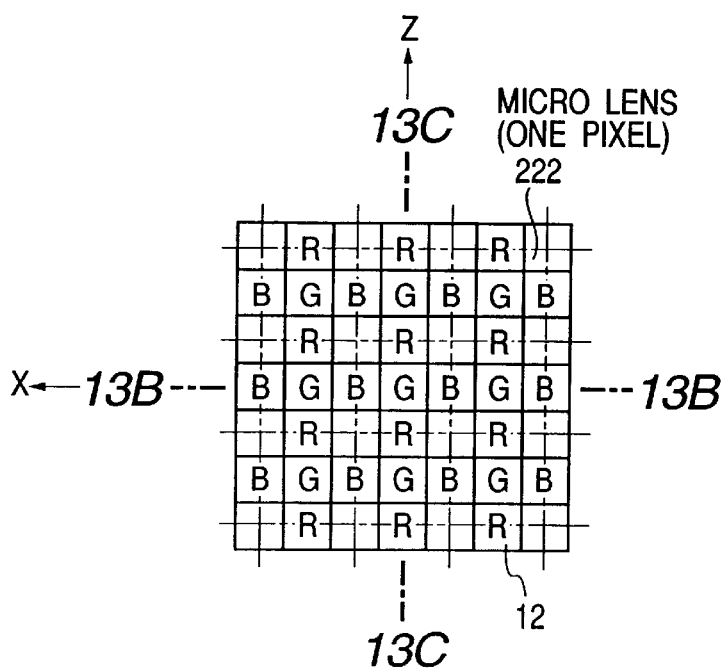
FIGS. 13A, 13B and 13C are schematic illustrations of the principle of color separation and color synthesis, underlying the second embodiment of liquid crystal panel.
Figure 13C:
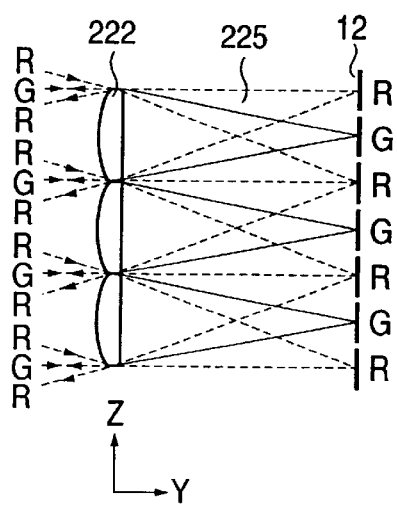
Figure 13B:
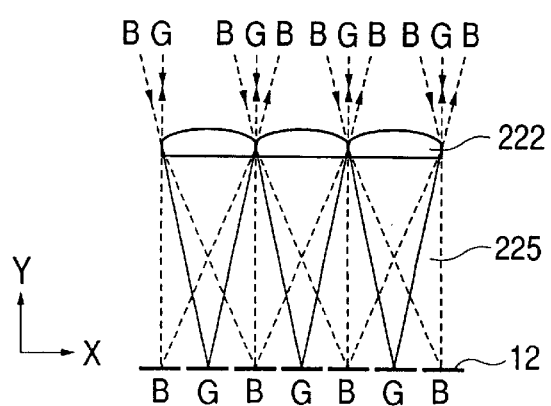

FIGS. 13A, 13B and 13C are schematic illustrations of the principle of color separation and color synthesis, underlying the liquid crystal panel 202 of this embodiment. FIG. 13A is a schematic plan view of the liquid crystal panel, whereas FIG. 13B and FIG. 13C respectively show schematic cross sectional views taken along line 13B—13B (along the x-direction) and line 13C—13C (along the z-direction) of FIG. 13A. Note that FIG. 13C corresponds to the cross sectional view of FIG. 12 taken along the y-z plane and shows how beams of G light and R light enter and go out from the respective micro-lenses 222. As seen, each G pixel electrode is located right below a corresponding micro-lens and each R pixel electrode is located right below the boundary line of corresponding two adjacent micro-lenses. Therefore, the angle of incidence θ of R light is preferably so selected that tan θ is equal to the ratio of the pitch of pixel arrangement (B and R pixels) to the distance between the micro-lenses and the pixel electrode. On the other hand, FIG. 13B corresponds to a cross section of the liquid crystal panel 202 taken along the x-y plane. As for the cross section along the x-y plane, it will be understood that B pixel electrodes and G pixel electrodes are arranged alternately as shown in FIG. 13C and each G pixel electrode is located right below a corresponding micro-lens whereas each B pixel electrode is located right below the boundary line of corresponding two adjacent micro-lenses. B light for irradiating the liquid crystal panel enters the latter slantly as viewed from the cross section (the x-y plane) of FIG. 13B after having been polarized by the PBS 203 as described above. Thus, just like R light, each beam of B light entering from a corresponding micro-lens 222 is reflected by a corresponding B pixel electrode 12b as shown and goes out of the panel through the adjacently located micro-lens 222 in the x-direction. The mode of modulation by the liquid crystal on the B pixel electrodes 12b and that of projection of B light coming out of the liquid crystal panel are same as those described above by referring to G light and R light. Each B pixel electrode 12b is located right below the boundary line of corresponding two adjacent micro-lenses. Therefore, the angle of incidence θ of B light is preferably so selected that tan θ is equal to the ratio of the pitch of pixel arrangement (G and B pixels) to the distance between the micro-lenses and the pixel electrode. The pixels of the liquid crystal panel of this embodiment are arranged RGRGRG . . . in the z-direction and BGBGBG . . . in the x-direction. FIG. 13A shows the pixel arrangement as viewed from above. As seen, each pixel has a size equal to a half of a micro-lens for both longitudinally and transversally so that the pixels are arranged at a pitch twice as high as the micro-lenses. As viewed from above, each G pixel is located right below a corresponding micro-lens, while each R pixel is located right below the boundary line of corresponding two adjacent micro-lenses in the z-direction and each B pixel is located right below the boundary line of corresponding two adjacent micro-lenses in the x-direction. Each micro-lens has a rectangular contour (and is twice as large as a pixel).

Figure 14:
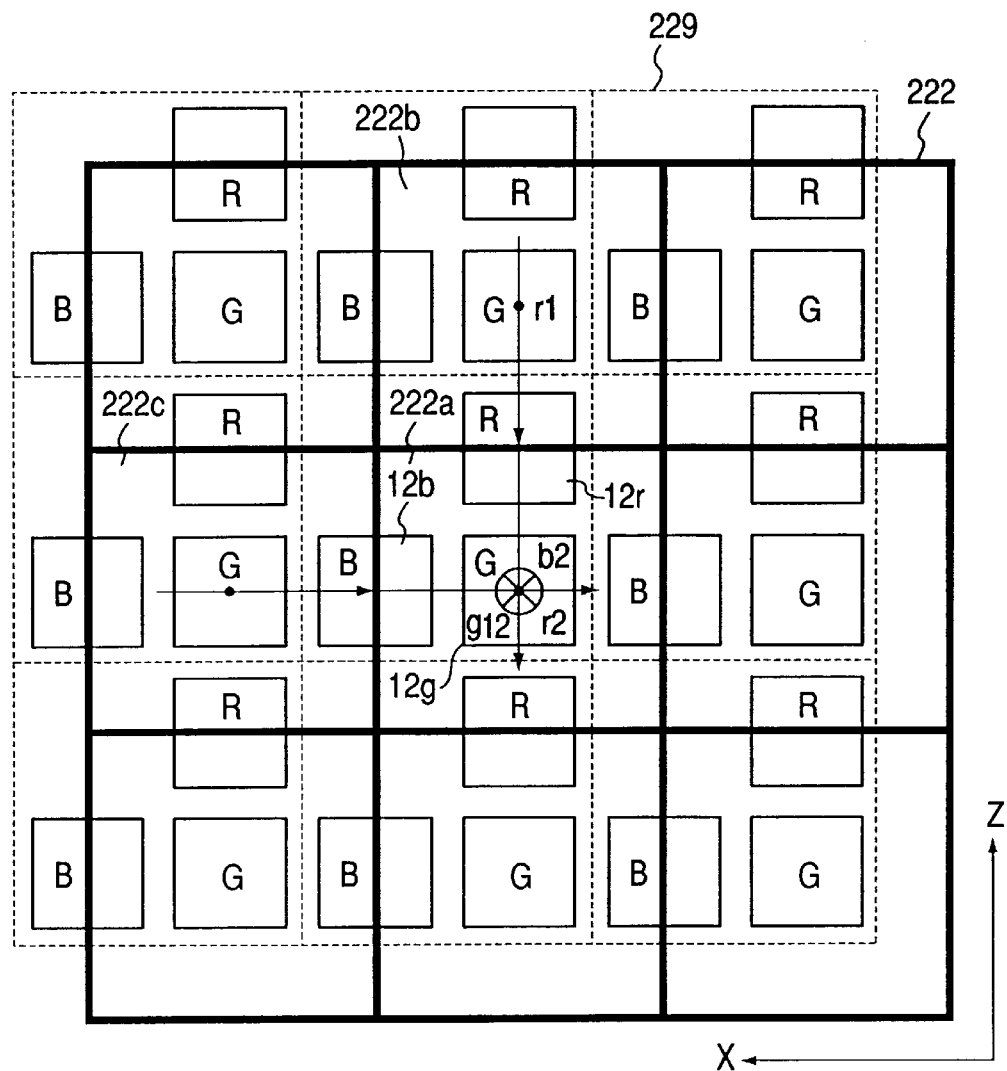
FIG. 14 is an enlarged partial plan view of the second embodiment of liquid crystal panel.

FIG. 14 is an enlarged partial plan view of the liquid crystal panel of this embodiment. Each square 229 defined by broken lines indicates a unit of RGB pixels. In other words, when the RGB pixels of the liquid crystal panel are driven by the active matrix drive circuit section 227 of FIG. 12, the unit of RGB pixels in each broken line square 229 is driven by corresponding RGB picture signals. Now, take the picture unit of R pixel electrode 12r, G pixel electrode 12g and B pixel electrode 12b. The R pixel electrode 12r is illuminated by R light coming from the micro-lens 222b and striking the pixel electrode aslant as indicated by arrow r1 and reflected R light goes out through the micro-lens 222a as indicated by arrow r2. The B pixel electrode 12b is illuminated by B light coming from the micro-lens 222c and striking the pixel electrode aslant as indicated by arrow b and reflected B light goes out through the micro-lens 12a as indicated by arrow b2. Finally, the G pixel electrode 12g is illuminated by G light coming from the micro-lens 222a and striking the pixel electrode perpendicularly (downwardly in FIG. 14) as indicated by arrow g12 showing only the back and reflected G light goes out through the same micro-lens 222a perpendicularly (upwardly in FIG. 14). Thus, while the beams of light of the three primary colors striking the picture unit of RGB pixels enters through different micro-lenses, they go out through a same micro-lens (222a). The above description applies to all the picture unit (of RGB pixels) of the embodiment.

Figure 16:
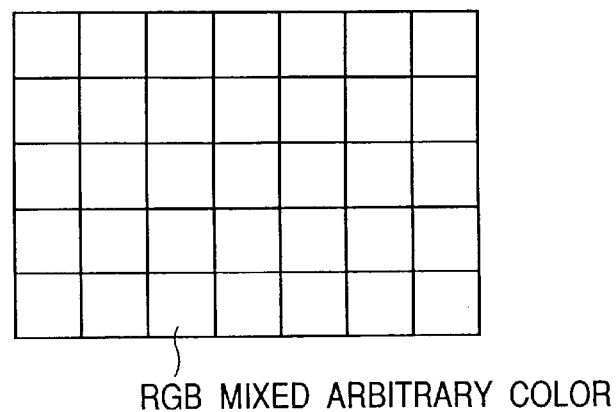
FIG. 16 is an enlarged partial plan view of an image projected on the display screen of the second embodiment of liquid crystal type liquid crystal display apparatus.
Figure 15:
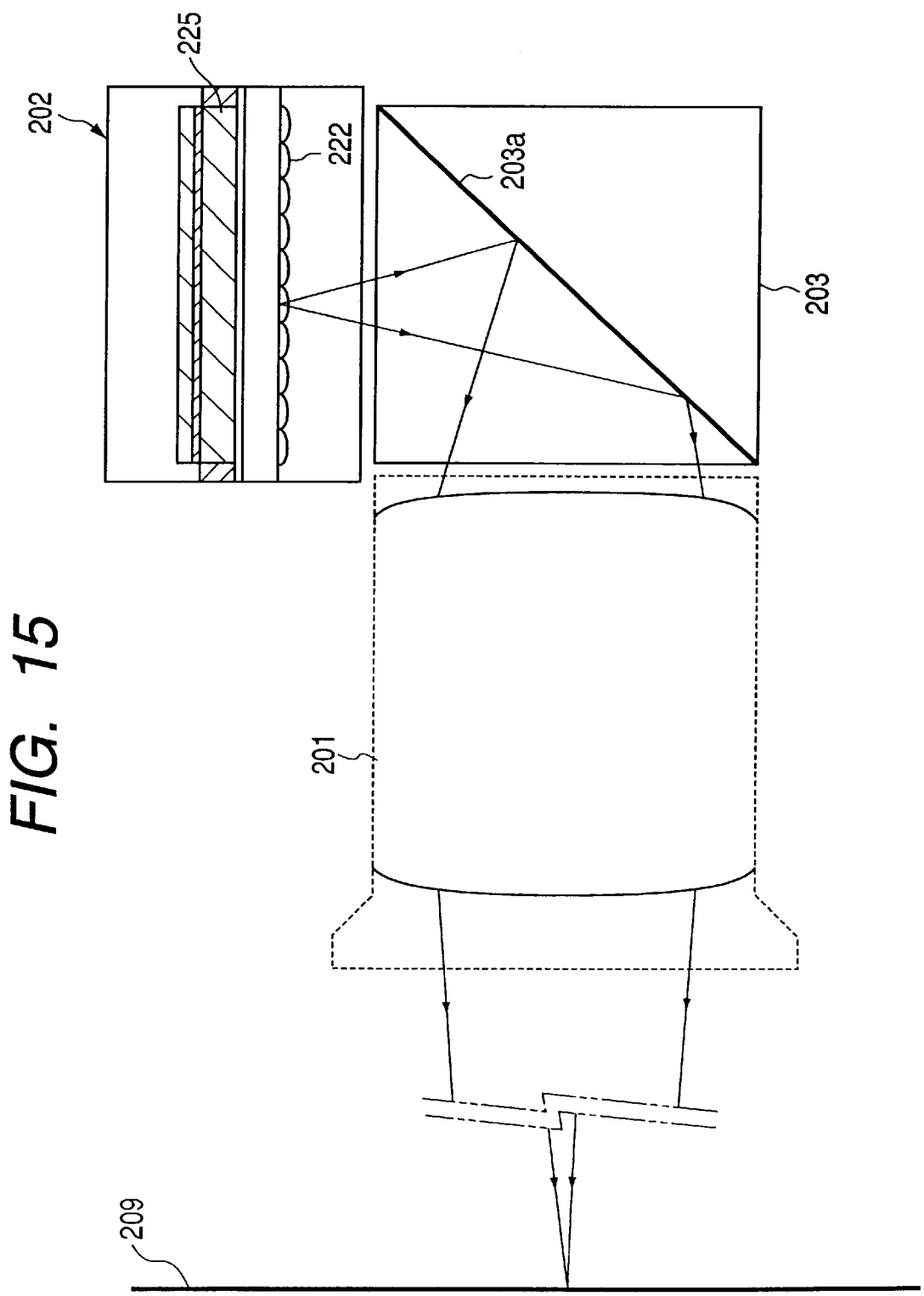
FIG. 15 is a schematic illustration of part of the projection optical system of the second embodiment of projection type liquid crystal display apparatus.

Therefore, when light emitted from the liquid crystal panel of this embodiment is projected onto the screen 209 by way of the PBS 203 and the projection lens 201 in such a way that a focused image of the micro-lenses 222 of the liquid crystal panel 202 is projected on the screen by regulating the optical system as shown in FIG. 16, the projected image will show the picture units of RGB pixels for the corresponding respective micro-lenses as perfect white light obtained by mixing the beams of light of the three primary colors as shown in FIG. 16. The net result will be the display of high quality color images free from the mosaic of RGB.

FIG. 12 schematically shows part of a semiconductor device 300 where an active matrix drive circuit 227 and pixel electrodes 12 arranged on a silicon semiconductor substrate 228. The semiconductor device 300 will be discussed in greater detail hereinafter. The semiconductor device will show a cross sectional view exactly same as the semiconductor device 24 comprising pixel electrodes as shown in FIG. 1, the process of manufacturing it being described in detail by referring to Embodiment 1.

Figure 17:
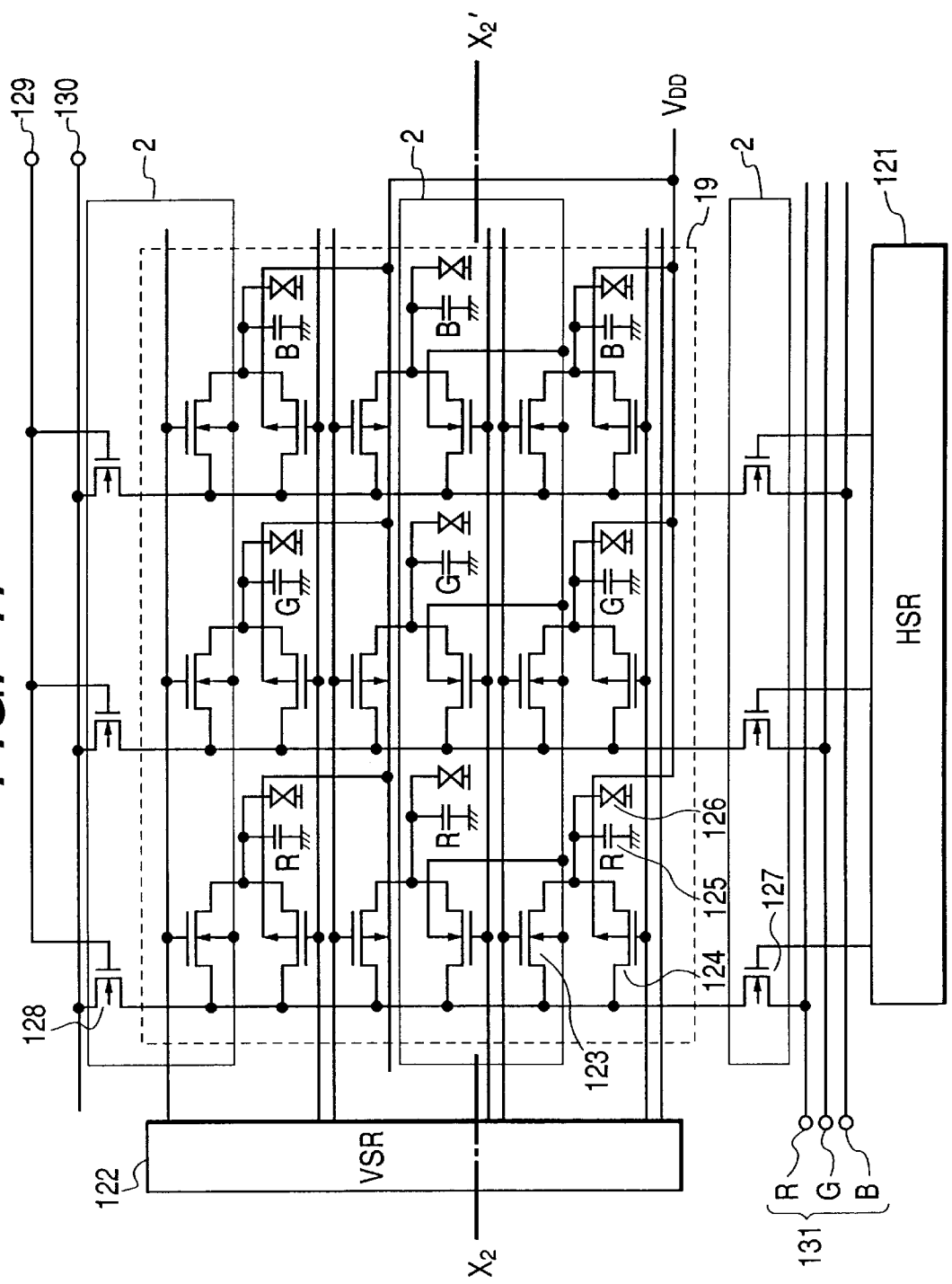
FIG. 17 is a schematic circuit diagram of the second embodiment of liquid crystal apparatus.

FIG. 17 is a schematic circuit diagram of the semiconductor device 300.

FIG. 17 shows a horizontal shift register 121, a vertical shift register 122, an n-channel MOSFET 123, a p-channel MOSFET 124, a hold capacitance 125, a liquid crystal capacitance 126, a signal transfer switch 127, a reset switch 128, a reset pulse input terminal 129, a reset power supply terminal 130 and an RGB video signal input terminal 131.

The hold capacitance 125 of FIG. 17 is used to hold signals between each of the pixel electrodes 12 and the opposite transparent electrode 224. The substrate potential is applied to the well region 2.

In the transmission gates of this embodiment, n-channel MOSFETs 38 and p-channel MOSFETs 39 are arranged respectively high and low in the first row whereas p-channel MOSFETs 38 and n-channel MOSFETs 39 are arranged respectively high and low in the second row and so on in an alternating fashion. As described above, the pixel electrodes 12 are held in contact not only with the power supply lines at the stripe-type wells in the peripheral zone of the display region but also with fine power source lines arranged in the display region.

With such a circuit configuration, the key of stabilization lies in the resistance of the wells. Therefore, it is so arranged that, if a p-type substrate is used, n-type wells have a contact area or a number of contacts greater than the contact area or the number of contacts, whichever appropriate, of the p-type wells. Then, the p-type wells are secured for a predetermined potential by the p-type substrate, which operates as a low resistance member. While they may be affected to show a swinging potential by the input and output signals of the source/drains of the n-type wells arranged like islands, such a phenomenon can be prevented by increasing the contact area of the upper wiring layers to stably display high quality images.

Video signals (including proper video signals, pulse-modulated digital signals, etc.) are input through the video signal input terminal 31 and the signal transfer switches 27 are closed or opened according to the pulses from the horizontal shift register 34 to output the signals to the data wires. A high pulse is applied from the vertical shift register 36 to the gates of the n-channel MOSFETs 38 of the selected row, whereas a low pulse is applied from the vertical shift register 22 to the gates of the p-channel MOSFETs of that row.

As described above, the switches of the pixel section are constituted by monocrystalline CMOS transmission gates so that signals to be written on the pixel electrodes are not restricted by the threshold value of the MOSFETs and the signals of the sources can be written without restrictions.

Additionally, since the switches of the pixel section are constituted by monocrystalline transistors, they do not show any instability in the operation that can occur along the crystal grain boundaries of polysilicon-TFTs and hence can show a highly reliable and quick drive effect.

While the RGB pixels are arranged simply side by side in the circuit diagram of FIG. 17 because the active matrix drive circuit section is located below the pixel electrodes 12, the drains of the pixel FETs are in fact connected to the RGB pixel electrodes 12 that are arranged two-dimensionally as shown in FIG. 14.

Now, a peripheral drive circuit obtained by modifying that of the second embodiment will be described by referring to FIG. 18.

Figure 18:
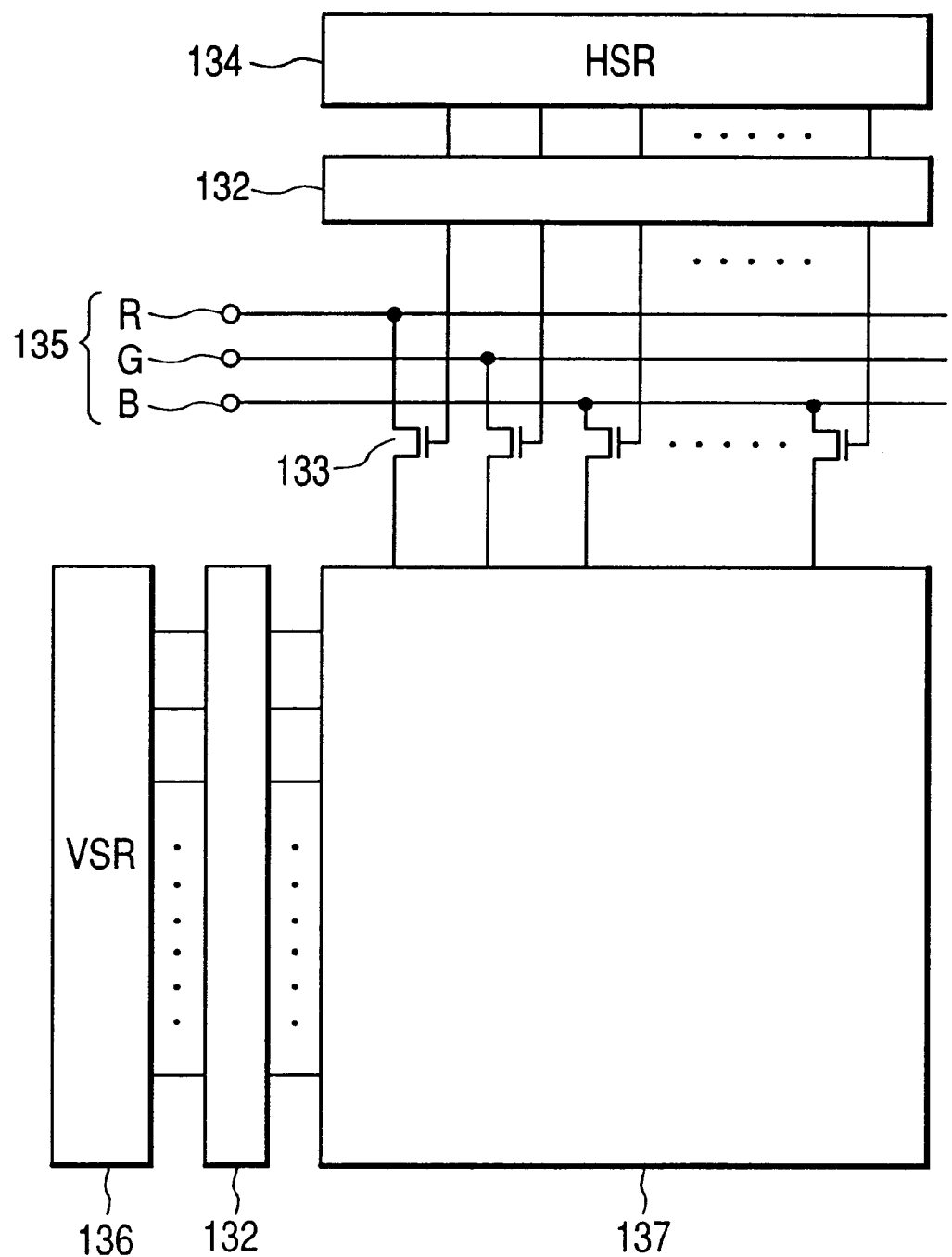
FIG. 18 is a schematic block diagram of the second embodiment of liquid crystal apparatus.

FIG. 18 is a schematic block diagram of the modified peripheral drive circuit.

In FIG. 18, there are shown a level shifter circuit 132, a video signal sampling switch 133, a horizontal shift register 134, an RGB video signal input terminal, a vertical shift register 136 and a display region 137.

With the above arrangement, the logic circuits including shift registers of both the horizontal shift register and the vertical shift register can be driven by a low voltage of about 1.5V to 5V regardless of the amplitude of the incoming video signal to realize a high speed and a low power consumption rate for operation. The horizontal and vertical shift registers can be driven for scanning operations bi-directionally by means of selection switches so that they can adapt themselves to positional rearrangements of the optical system and other modifications without modifying the panel. Thus, same and identical panels can be used for different product lines to reduce the manufacturing cost.

While the video signal sampling switches of FIG. 18 are of a one-transistor type with one-side polarity, input video signals can accurately be written on the signal lines by using this embodiment comprising switches constituted by CMOS transmission gates in a manner as described above.

When using CMOS transmission gates for switches, they may be affected by the video signal to swing depending on the difference between the area of the NMOS gate and that of the PMOS gate and/or the difference in the overlapping capacitance of the gate and the source/drain. However, this problem can be avoided by connecting the source/drain of a MOSFET having a gate volume equal to about a ½ of the gate volume of the MOSFET of the sampling switch to a signal line for each polarity and by applying pulses with phases reversed relative to each other. With this arrangement, good video signals can be written on the signals lines to improve the quality of the displayed image.

Since the relationship between the sealing structure and the panel structure of this embodiment is identical with that of the first embodiment, whose plan view is schematically illustrated in FIG. 7, it will not described here any further.

Figure 19:
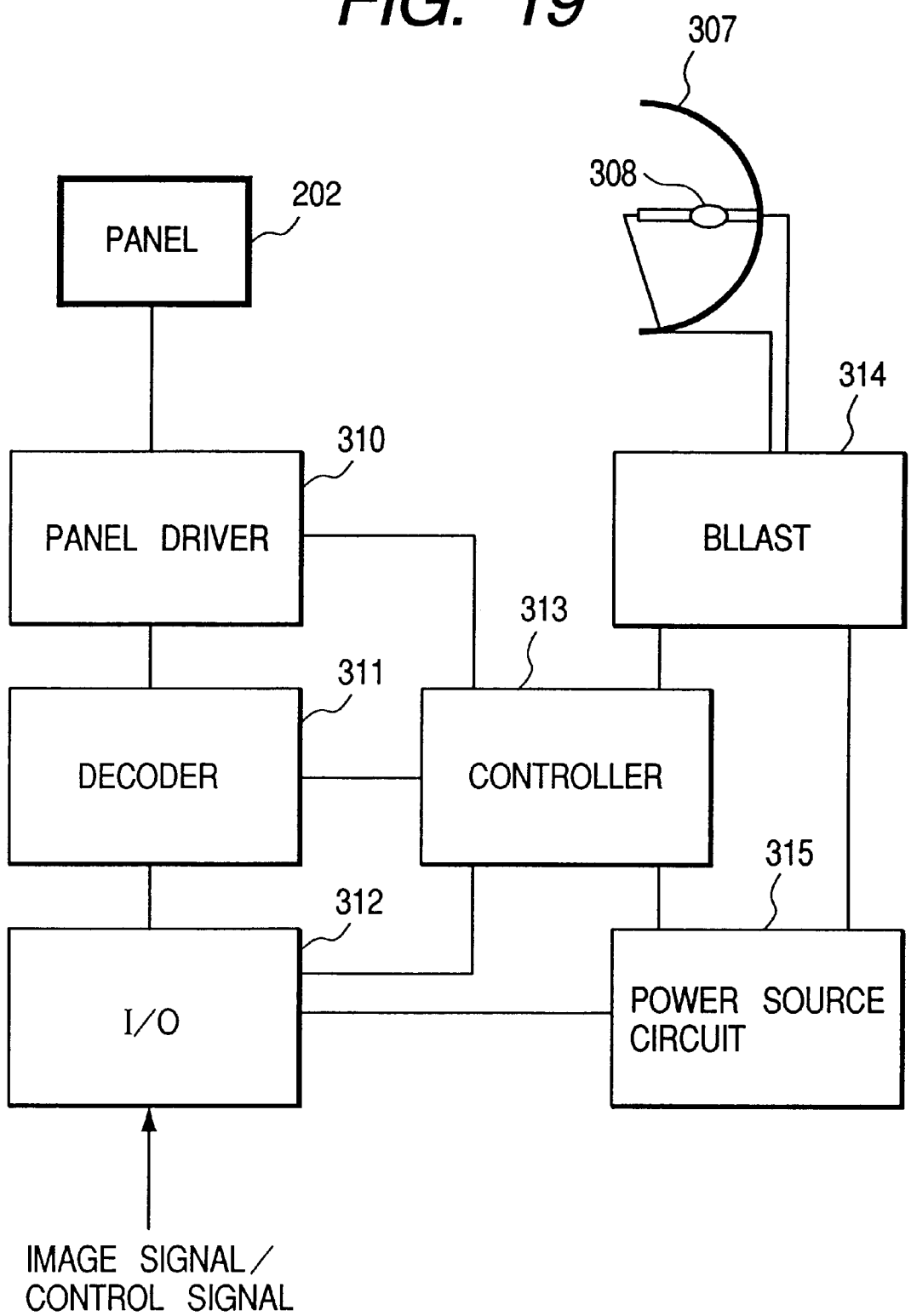
FIG. 19 is a schematic block diagram of the drive circuit of the second embodiment of projection type liquid crystal display apparatus realized on the basis of the present invention.

FIG. 19 shows a schematic block diagram of the drive circuit system of this embodiment of projection type liquid crystal display apparatus. Reference numeral 310 denotes a panel driver for producing liquid crystal drive signals obtained by reversing the polarities of RGB video signals and amplifying the voltage to a predetermined extent along with drive signals for driving the opposite electrode 224 and various timings signals. Reference numeral 312 denotes an interface adapted to decode video signals and control/transmission signals into standard video signals. Reference numeral 311 denotes a decoder for decoding standard video signals from the interface 312 into video signals for the three primary colors of RGB and synchronizing signals. Reference numeral 314 denotes a ballast for driving and turning on an arm lamp 308. Reference numeral 315 denotes a power supply circuit for feeding the circuit blocks with power. Reference numeral 313 denotes a controller comprising an operating section (not shown) and adapted to comprehensively control the circuit blocks. A projection type liquid crystal display apparatus having configuration as described above is popular and can display high quality color images free from the above pointed out problem of a mosaic of RGB.

Figure 20:
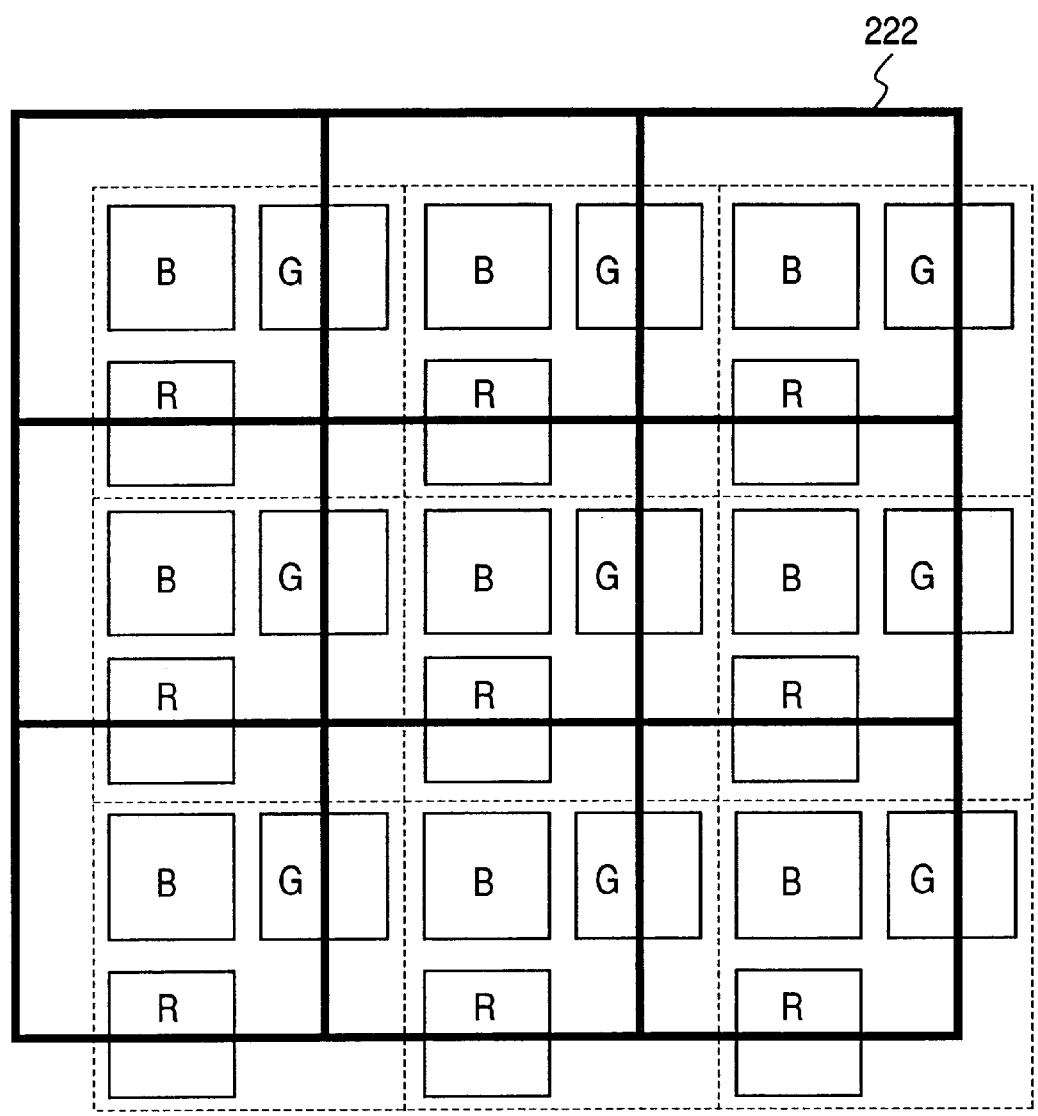
FIG. 20 is an enlarged partial plan view of a liquid crystal panel obtained by modifying the second embodiment.

FIG. 20 is an enlarged partial plan view of another liquid crystal panel that can be used for this embodiment. In this panel, each B pixel electrode is arranged right below the center of a corresponding micro-lens 222 and sided transversally by a pair of G pixel electrodes and longitudinally by a pair of R pixel electrodes. With this arrangement, the panel operates exactly same as the above described panel as B light is made to strike it perpendicularly while R/G light is made to enter it slantly (with a same angle of incidence but in different directions) so that the beams of reflected light of the three primary colors come out of the respective RGB pixel electrodes of the corresponding picture unit through a common micro-lens. Alternatively, each R pixel electrode may be arranged right below a corresponding micro-lens 222 and sided by a pair of G pixel electrodes horizontally and by a pair of B pixel electrodes vertically.

Figure 22A:
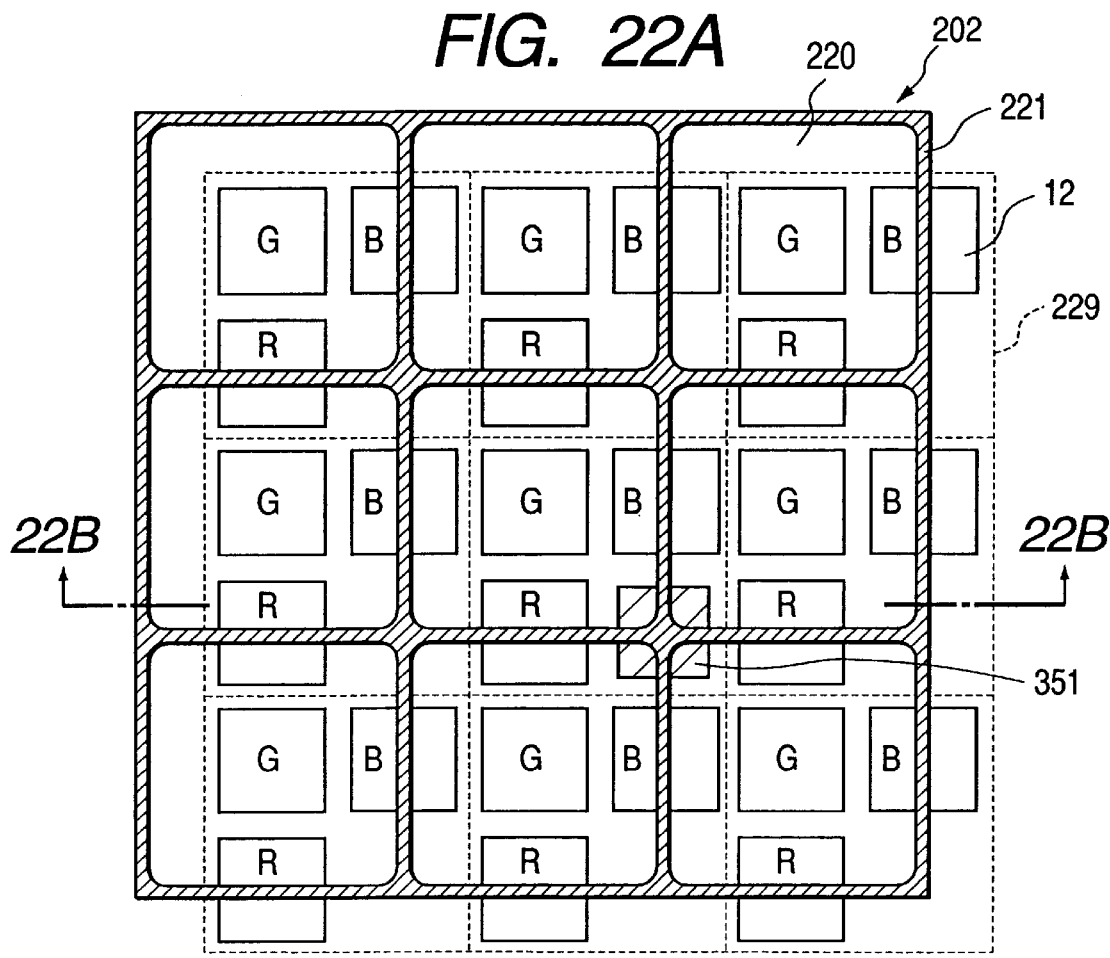
FIGS. 22A and 22B are an enlarged partial plan view and a schematic cross sectional view of the modified second embodiment of liquid crystal panel.
Figure 22B:
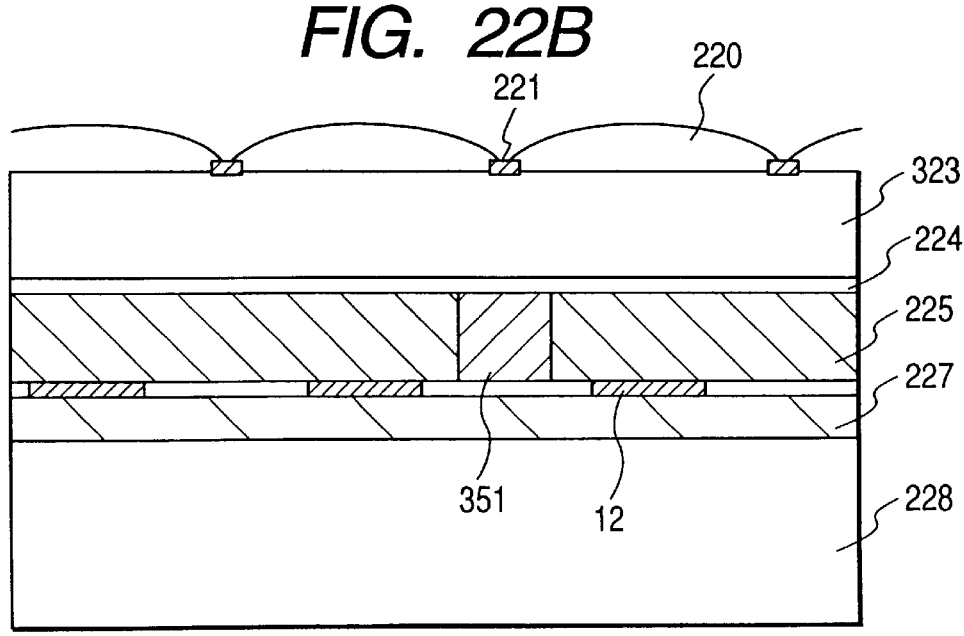
Figure 23:
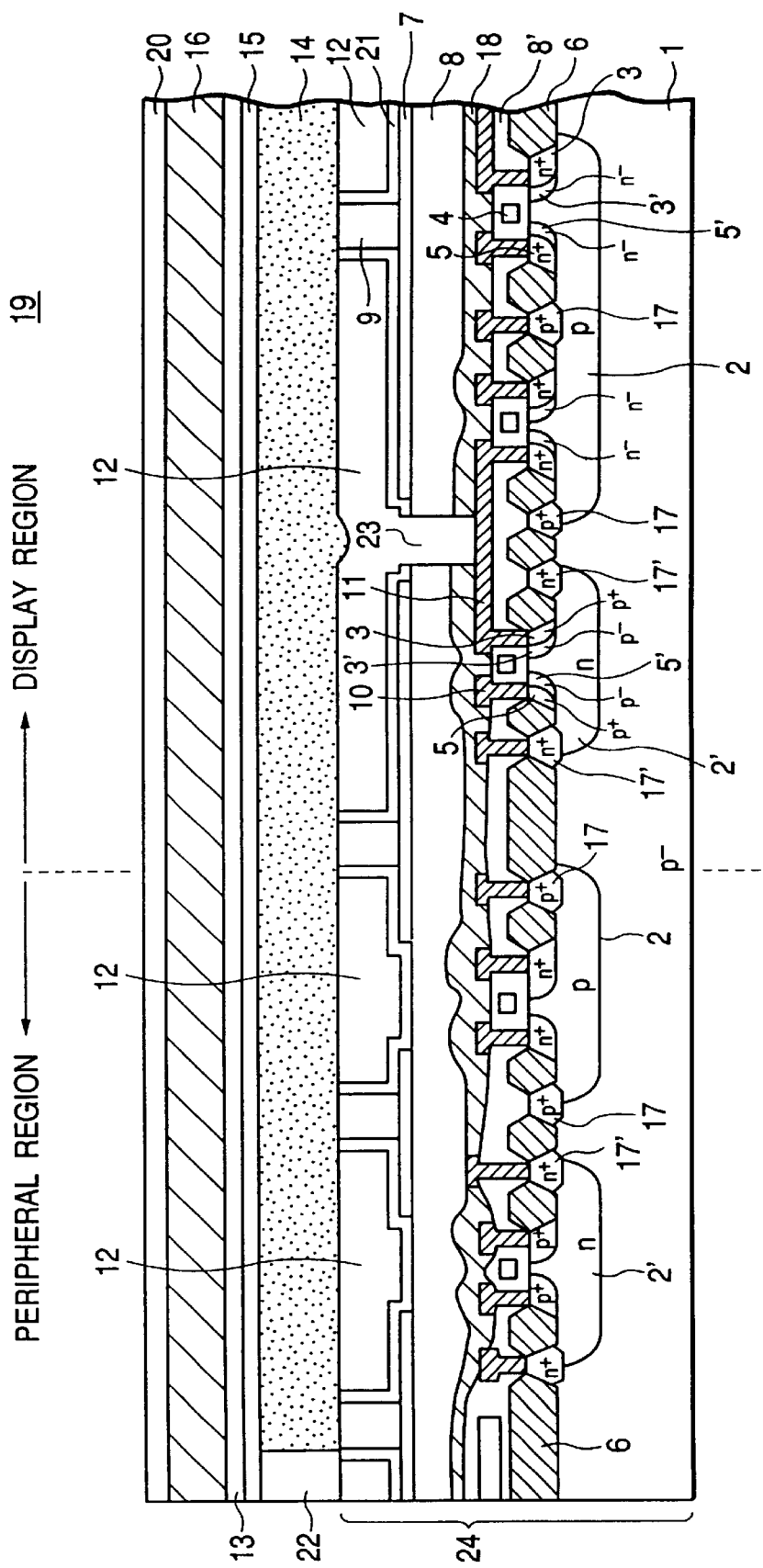
FIG. 23 is an enlarged partial cross sectional view of a known projection type liquid crystal panel.

FIG. 21 is an enlarged schematic partial cross sectional view of a liquid crystal panel 202 obtained by modifying the second embodiment. This modified embodiment differs from the second embodiment in that a piece of sheet glass 323 is used as opposite glass substrate and the micro-lenses 220 are formed on the sheet glass 323 by means of thermoplastic resin and a reflow technique. Additionally, column spacers 351 are formed in non-pixel areas by means of photosensitive resin and photolithography. FIG. 22A shows a schematic partial plan view of the liquid crystal panel 202. As shown, the column spacers 351 are formed in non-pixel areas at selected corners of the mircro-lenses 220 at a predetermined pitch. FIG. 22B shows a schematic cross sectional view of the embodiment taken along line 22B—22B in FIG. 22A and across a column spacer 351. Column spacers 351 are preferably arranged at a pitch of every 10 to 100 pixels so as to show a matrix arrangement. Care has to be taken so that the number of column spacers can satisfy the two contradictory requirements of the planeness of the sheet glass 323 and the pourability of liquid crystal. Still additionally, a light shielding layer 321 of patterned metal film is arranged in this modified embodiment to prevent stray light from entering through boundary areas of the micro-lenses. This can effectively prevent any degradation of color saturation and contrast due to stray light. Thus, a projection type display apparatus comprising the embodiment of liquid crystal panel can display images of even higher quality particularly in terms of color saturation and contrast.

As described in detail above, according to the invention, completely plane and smooth pixel electrodes can be realized at low cost to produce a liquid crystal panel that operates stably in terms of electric performance.

When such a liquid crystal panel is incorporated into a display apparatus comprising a peripheral circuit section and an optical system as described above by referring to the above embodiments, the display apparatus will show a high reflectivity to display images with a high brightness and an enhanced contrast because the perfect smoothness of the pixel electrodes. Additionally, such a display apparatus can be prepared at low cost because of the reduced cost of preparing the liquid crystal panel it comprises.

What is claimed is:

1. A semiconductor device comprising a structure formed by laminating, on a main electrode of a semiconductor element, a first insulation film, a first electroconductive film, a second insulation film and a second electroconductive film in this order, wherein a contact hole penetrates through said first and second insulation films for use in forming an electrical contact between said main electrode and said second electroconductive film, and has a stepped sectional profile, such that a width of a top opening section of said contact hole is defined by said first insulation film defined in a self-aligning manner in relation to an opening of said first electroconductive film, said top opening section having a depth greater than a thickness of said first electroconductive film.

2. A method of manufacturing a semiconductor device according to claim 1, said semiconductor device having a semiconductor substrate, a principal electrode mounted on the substrate and said contact hole, said method comprising steps of:

(1) forming a coat of a first insulation film on the surface of the substrate;

(2) forming a coat of a first electroconductive film and patterning it to a desired profile;

(3) forming a coat of a second insulation film and patterning it to a desired profile, said first insulation film being simultaneously processed in a self-aligning manner relative to the patterned profile of said first electroconductive film within the region produced by removing said first electroconductive film in step (2) and located within the region being removed of the second insulation film;

(4) forming a coat of a third insulation film and forming a contact hole connected to said principal electrode of the semiconductor device within the region of said first insulation film processed in a self-aligning manner relative to the patterned profile of said first electroconductive film in said step (3); and (5) forming a coat of a second electroconductive film and patterning it to a desired profile;

to make the size of the contact hole change stepwise.

3. A method of manufacturing a semiconductor device according to claim 2, wherein said first insulation film has a multilayer structure including an SOG (spin on glass) layer.

4. A liquid crystal apparatus comprising a semiconductor device according to claim 1 and a liquid crystal.

5. A liquid crystal apparatus comprising a semiconductor device according to claim 1 and including a plurality of pixel electrodes arranged to form an active matrix and provided with respective switching devices and liquid crystal held between said pixel electrodes and a common electrode disposed vis-a-vis semiconductor devices.

6. A display apparatus comprising a liquid crystal apparatus according to claim 4 or 5.

7. A projection type liquid crystal display apparatus comprising a liquid crystal apparatus according to claim 4 or 5.

8. A projection type liquid crystal display apparatus according to claim 7, wherein at least three reflection type liquid crystal panels are arranged so as to be irradiated by rays of light of the three primary colors respectively, blue light being separated by means of a high reflection mirror and a blue reflecting dichroic mirror, red light and green light being separated from each other by a red reflecting dichroic mirror and a green/blue reflecting dichroic mirror.

9. A semiconductor device comprising a structure formed by laminating, on main electrode, a first insulation film, a first electroconductive film, a second insulation film and a second electroconductive film in this order, said main electrode and said second electroconductive film being connected electrically through a contact hole, wherein said contact hole is formed in said first insulation film, and said contact hole comprises upper and lower level portions to form a stepped profile, the upper level portion having an aperture width greater than that of said lower level portion, the aperture of the upper level portion of said contact hole being formed along a width of a portion of said first insulation film on which said first electroconductive film is not formed, said second insulation film on said first electroconductive film extends beyond said first electroconductive film to a side surface of the aperture of said upper level portion, said upper level portion comprising upper and lower sub level portions, of which widths are different by said second insulation film, and said second electroconductive film is disposed also on said second insulation film and an inside of said contact hole, and said second electroconductive film on said second insulation film electrically contacts said main electrode through said contact hole.

10. A semiconductor device according to claim 9, comprising a third insulation film dividing said second electroconductive film into one and another disposed on said first electroconductive film.

11. A semiconductor device according to claim 9, wherein the aperture of the upper level portion of said contact hole is formed by over-etching the portion of said first insulation film on which said first electroconductive film is not formed.

12. A semiconductor device according to claim 9, further comprising a liquid crystal display device, wherein said semiconductor device is a device section of said liquid crystal display device.

13. A method for producing a semiconductor device comprising a structure formed by laminating, on a main electrode, a first insulation film, a first electroconductive film, a second insulation film and a second electroconductive film in this order, said main electrode being electrically connected to said second electroconductive film through a contact hole, comprising steps of:

forming said first insulation film on said main electrode;

forming said first electroconductive film on said first insulation film;

providing on said first insulation film at an area on which said first electroconductive film is not disposed;

forming a third insulation film on said area on which said first electroconductive film is not disposed;

etching said third insulation film on said area on which said first electroconductive film is not disposed, and overetching said first insulation film in said area on which said first electroconductive film is not disposed, along a shape of said area on which said first electroconductive film is not disposed;

forming said second insulation film on a side surface of said first electroconductive film in said region on which said first electroconductive film is not disposed, and on top and bottom surfaces of said first insulation film exposed by the overetching;

etching in a direction toward said main electrode a portion of said second insulation film formed at a bottom of said first insulation film and said first insulation film directly over the part of said second insulation film, wherein the contact hole formed in said first insulation film by said over-etching and said step of etching in the direction toward said main electrode comprises upper and lower level portions, the upper level portion having an aperture width greater than that of said lower level portion to form a stepped profile, and forming a second electroconductive film on said second insulation film disposed on said first electroconductive film and in said contact hole, to electrically connect said second electroconductive film on said second insulation film to said main electrode.

14. A method according to claim 13, further comprising forming a dividing member of said third insulation film for dividing said second electroconductive film into one and another.

15. A method according to claim 13, further comprising steps of:

disposing a liquid crystal on said second electroconductive film; and disposing a counter electrode in opposition to said second electroconductive film so as to sandwich said liquid crystal between said counter electrode and said second electroconductive film.

* * * * *

UNITED STATES PATENT AND TRADEMARK OFFICE
CERTIFICATE OF CORRECTION

PATENT NO.   : 6,411,349 B2
DATED         : June 25, 2002
INVENTOR(S)  : Toru Nakazawa et al.

It is certified that error appears in the above-identified patent and that said Letters Patent is hereby corrected as shown below:

Title page,
Item [54], Title, "SEMICONDUCTOR DEVICE, DISPLAY APPARATUS USING SUCH DEVICES AND METHOD OF MANUFACTURING SUCH AN APPARATUS AS WELL AS THAT OF MANUFACTURING SUCH AN APPARATUS" should read -- SEMICONDUCTOR DEVICE, DISPLAY APPARATUS USING SUCH DEVICES AND METHOD OF MANUFACTURING SUCH A DEVICE AS WELL AS THAT OF MANUFACTURING SUCH AN APPARATUS --.

Column 1,
Line 3, "AN" should read -- A --; and
Line 4, "APPARATUS" should read -- DEVICE --.

Column 6,
Line 65, "electrodes" should read -- electrode --.

Column 11,
Line 67, "constrasty" should read -- contrasting --.

Column 12,
Line 43, "show" should read -- shows --.

Column 13,
Line 1, "in stead" should read -- instead --; and
Line 4, "operate" should read -- operates --.

Column 17,
Line 11, "slantly" should read -- slantedly --.

Column 19,
Line 56, "not" should read -- not be --.

Column 21,
Line 57, "vis-a-vis" should read -- vis-à-vis --.

UNITED STATES PATENT AND TRADEMARK OFFICE
CERTIFICATE OF CORRECTION

PATENT NO. : 6,411,349 B2
DATED : June 25, 2002
INVENTOR(S) : Toru Nakazawa et al.

It is certified that error appears in the above-identified patent and that said Letters Patent is hereby corrected as shown below:

<u>Column 22,</u>
Line 5, "main" should read -- a main --;
Line 23, "sub" should read -- sub- --;
Line 54, "at" should be deleted; and
Line 60, "overetching" should read -- over-etching --.

Signed and Sealed this

Nineteenth Day of November, 2002

*Attest:*

JAMES E. ROGAN
*Attesting Officer*  *Director of the United States Patent and Trademark Office*